United States Patent
Li et al.

(10) Patent No.: US 9,991,378 B2
(45) Date of Patent: Jun. 5, 2018

(54) TRENCH POWER SEMICONDUCTOR DEVICE

(71) Applicant: SINOPOWER SEMICONDUCTOR, INC., Hsinchu (TW)

(72) Inventors: Po-Hsien Li, Tainan (TW); Wei-Chieh Lin, Hsinchu (TW); Jia-Fu Lin, Yilan County (TW); Guo-Liang Yang, Hsinchu (TW)

(73) Assignee: SINOPOWER SEMICONDUCTOR, INC., Hsinchu (TW)

( * ) Notice: Subject to any disclaimer, the term of this patent is extended or adjusted under 35 U.S.C. 154(b) by 0 days. days.

(21) Appl. No.: 15/186,685

(22) Filed: Jun. 20, 2016

(65) Prior Publication Data

US 2017/0365708 A1    Dec. 21, 2017

(51) Int. Cl.
| | |
|---|---|
| *H01L 29/66* | (2006.01) |
| *H01L 29/78* | (2006.01) |
| *H01L 29/40* | (2006.01) |
| *H01L 29/06* | (2006.01) |
| *H01L 29/10* | (2006.01) |

(52) U.S. Cl.
CPC ...... *H01L 29/7813* (2013.01); *H01L 29/0696* (2013.01); *H01L 29/1095* (2013.01); *H01L 29/407* (2013.01); *H01L 29/66734* (2013.01); *H01L 29/7806* (2013.01); *H01L 29/7811* (2013.01)

(58) Field of Classification Search
CPC ............ H01L 29/7813; H01L 29/0696; H01L 29/1095; H01L 29/407; H01L 29/66734; H01L 29/7806; H01L 29/7811
See application file for complete search history.

(56) References Cited

U.S. PATENT DOCUMENTS

| | | | | |
|---|---|---|---|---|
| 7,936,009 B2 * | 5/2011 | Pan | ...................... | H01L 29/407 257/330 |
| 8,034,685 B1 * | 10/2011 | Venkatraman | ........ | H01L 29/407 438/270 |
| 2005/0145934 A1 | 7/2005 | Kocon et al. | | |
| 2008/0064168 A1 * | 3/2008 | Kraft | ............... | H01L 21/823437 438/270 |
| 2011/0127603 A1 | 6/2011 | Burke et al. | | |
| 2012/0220091 A1 | 8/2012 | Challa et al. | | |
| 2012/0292693 A1 * | 11/2012 | Lee | ....................... | H01L 29/407 257/330 |
| 2012/0326227 A1 * | 12/2012 | Burke | .................. | H01L 29/407 257/330 |

* cited by examiner

*Primary Examiner* — Mark Tornow
(74) *Attorney, Agent, or Firm* — Li & Cai Intellectual Property (USA) Office

(57) ABSTRACT

A trench power semiconductor device is provided. A trench gate structure of the trench power semiconductor device located in a cell trench of an epitaxial layer includes a first dielectric layer, a second dielectric layer, a gate electrode, a third dielectric layer, and a shielding layer. The second dielectric layer is interposed between the first and third dielectric layers, and the second dielectric layer is made from different material than the first dielectric layer. After performing a selective etching step on the second dielectric layer, a recess can be formed among the first, second and third dielectric layers. The gate electrode includes a conductive layer formed in the recess region, and the shielding electrode is surrounded by the third dielectric layer and insulated from the conductive layer.

19 Claims, 18 Drawing Sheets

TRENCH POWER SEMICONDUCTOR DEVICE

BACKGROUND

1. Technical Field

The present disclosure relates to a power semiconductor device, in particular, to a trench power semiconductor device having shielding electrode.

2. Description of Related Art

Please refer to FIG. 1, which shows a cross-sectional schematic view of a prior art trench power transistor. The trench power transistor 1 includes two gates 130a, 130b and a shielding electrode 140, which are arranged in the same trench 100h and parallel to one another. The two gates 130a, 130b, and the shielding electrode 140 are insulated from one another through an oxide layer 131. During the fabrication of the trench power transistor 1, a portion of the shielding electrode 140 and a portion of the sidewalls of the trench 100 are oxidized by performing a thermal oxidation process to form the oxide layer 131 for isolating the shielding electrode 140 form the two gates 130a, 130b and a gate oxide 132. However, too thin a thickness of the oxide layer 131 fabricated by the thermal oxidation process results in higher capacitances between each of the gates 130a, 130b and the shielding electrode 140.

Furthermore, subjected to the limitation of the process conditions, the bottom portion of the oxide layer 131 is hard to form and is relatively thin. As such, each of gates 130a, 130b has a point portion 130s located at the bottom side closer to the shielding electrode 140. Therefore, the point effect easily occurs, thereby reducing the withstand voltage of the gates 130a, 130b and inducing the degradation of the gate under high temperature. Accordingly, the reliability of the power metal oxide semiconductor field transistor would decrease thereby affecting the lifetime of the trench power transistor.

SUMMARY

An exemplary embodiment of the present disclosure provides a trench power semiconductor device. The formation of the point portion at the bottom side of the gate electrode closer to the shielding electrode can be avoided.

An embodiment of the instant disclosure provides a trench power semiconductor device including a substrate, an epitaxial layer and a trench gate structure. The epitaxial layer disposed on the substrate has at least one cell trench formed therein. The trench gate structure is arranged in the cell trench and includes a first dielectric layer, a second dielectric layer, a gate electrode, a third dielectric layer, and a shielding electrode. The first dielectric layer is formed in the cell trench and has a contour substantially similar to that of an inner wall surface of the cell trench. The first dielectric layer has a first upper inner wall and a lower inner wall connecting the first upper inner wall, and the second dielectric layer at least covers the lower inner wall. The second dielectric layer is made from a different material than the first dielectric layer. The gate electrode is arranged in the cell trench and includes a first conductive layer covering the first upper wall, in which the first conductive layer has a bottom end connecting a first ending surface of the second dielectric layer. The third dielectric layer covers inner surfaces of the first conductive layer and the second dielectric layer. The shielding electrode is arranged in the cell trench and surrounded by the third dielectric layer to be isolated from the gate electrode.

Another embodiment of the instant disclosure provides a trench power transistor including a substrate, an epitaxial layer and a terminal electrode structure. The epitaxial layer disposed on the substrate and has at least one termination trench formed therein. The terminal electrode structure arranged in the termination trench includes a terminal dielectric layer, a conductive layer and a terminal electrode. The terminal dielectric layer has a contour substantially similar to that of an inner wall surface of the termination trench. The terminal dielectric layer includes a first insulating layer, a second insulating layer, and a third insulating layer, which are sequentially stacked on the inner wall surface of the termination trench, and the first and second insulating layers are made from different materials. An end face of the second insulating layer is depressed from the top surfaces of the first and third insulating layers to define a recess among the first, second and third insulating layers. The conductive layer is formed in the recess. The terminal electrode is arranged in the termination trench and isolated from the conductive layer by the third insulating layer.

To sum up, in the trench power semiconductor device provided by the instant disclosure, the first, second and third dielectric layers surrounding the gate electrode and shielding electrode are made of different materials to avoid the formation of the point portion at the bottom side of the gate electrode closer to the shielding electrode, thereby preventing the point effect from reducing the withstand voltage of the gate electrode.

In order to further understand the techniques, means and effects of the present disclosure, the following detailed descriptions and appended drawings are hereby referred, such that, through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Figure 1:
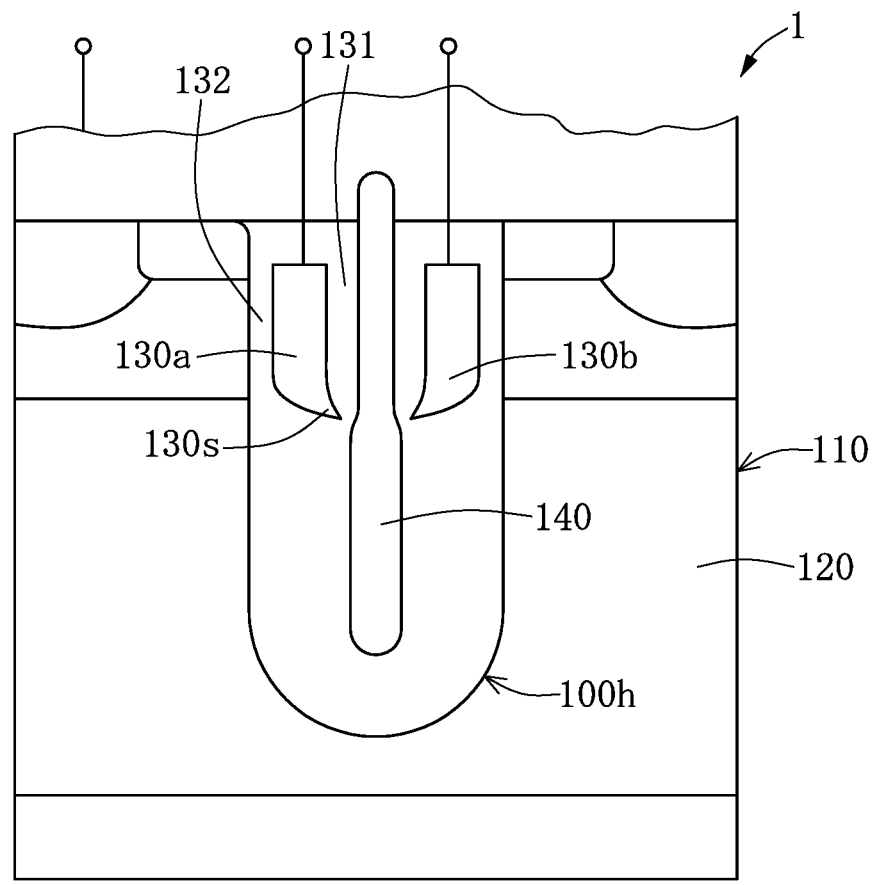
FIG. 1 shows a cross-sectional schematic view of a prior art trench power transistor.

Reference will now be made in detail to the exemplary embodiments of the present disclosure, examples of which are illustrated in the accompanying drawings. Wherever possible, the same reference numbers are used in the drawings and the description to refer to the same or like parts.

Figure 2:
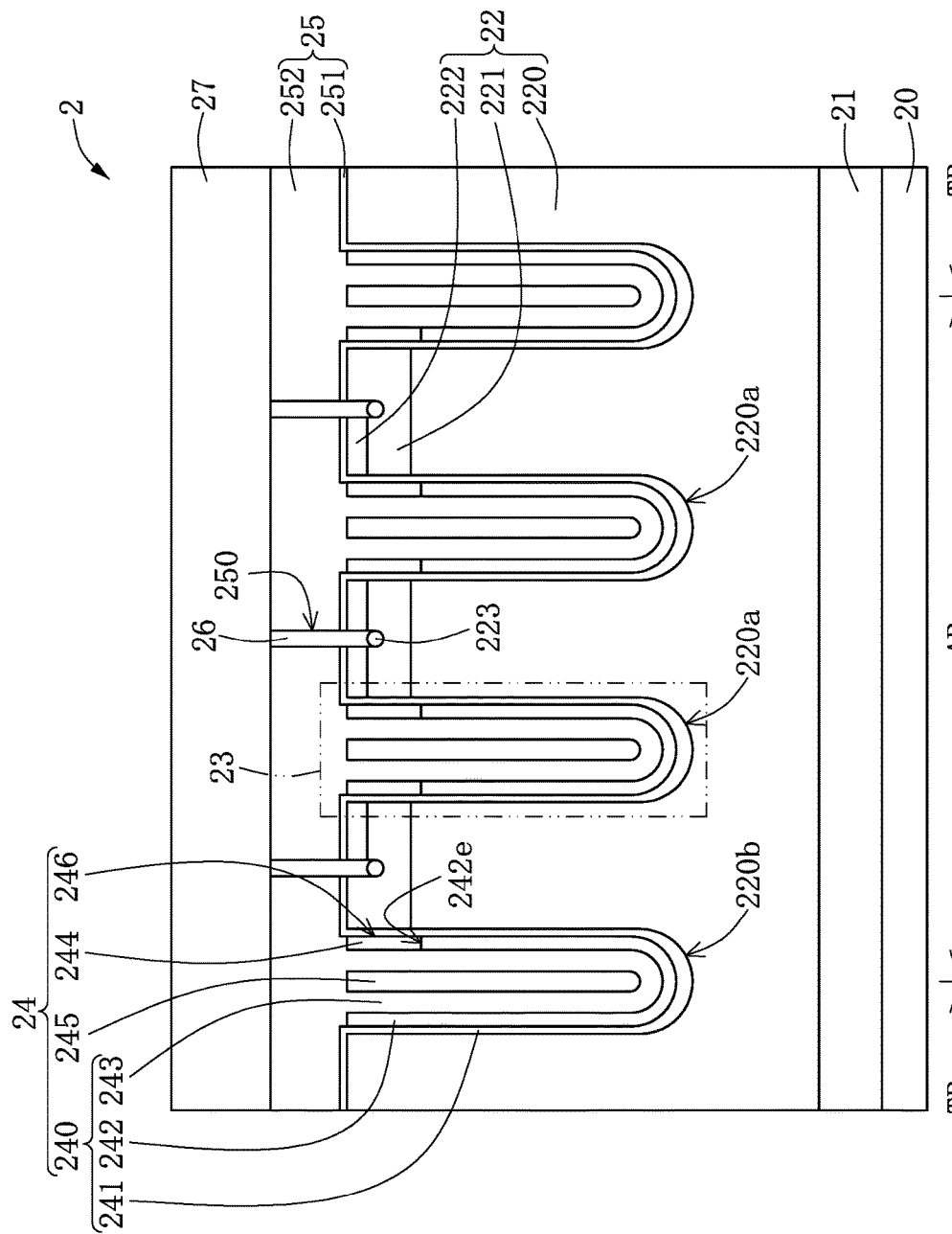
FIG. 2 shows a cross-sectional schematic view of a trench power semiconductor device in accordance with an embodiment of the instant disclosure.

Please refer to FIG. 2. In an embodiment, a trench power semiconductor device 2 includes a substrate 20, an epitaxial layer 22, a trench gate structure 23 and a terminal electrode structure 24.

The trench power semiconductor device 2 can be a trench power transistor or a power semiconductor including a schottky diode. In the embodiment shown in FIG. 2, the trench power transistor is taken as an example for description.

As shown in FIG. 2, the substrate 20 is doped with a higher concentration of first conductivity type impurities to serve as the drain of the trench power semiconductor device. The first conductivity type impurities can be n- or p-type impurities. If the substrate 20 is silicon substrate, the n-type impurities can be chosen from Group V ions, such as phosphorus ions or arsenic ions, and p-type impurities can be chosen from Group III ions, such as boron ions, aluminum ions, or gallium ions.

If the trench power semiconductor device is n-type power MOSFET, the substrate 20 is doped with n-type impurities; whereas, if the trench power MOSFET is p-type, the substrate 20 is doped with p-type impurities. In the embodiment of the instant disclosure, the N-type trench power MOSFET is taken as an example to describe the invention.

The epitaxial layer 22 of the same conductivity type as the substrate 20 is disposed on the substrate 20. The epitaxial layer 22 has a doped concentration less than that of the substrate 20. That is, taking the N-type trench power MOSFET for example, the substrate 20 is a heavily N-type doping ($N^+$) substrate and the epitaxial layer 22 is a lightly N-type doping ($N^-$) layer. On the contrary, taking the P-type trench power MOSFET for example, the substrate 20 is a heavily P-type doping ($P^+$) substrate and the epitaxial layer 22 is a lightly P-type doping ($P^-$) layer.

In the instant embodiment, the trench power semiconductor device 2 further includes a buffer layer 21 interposed between the substrate 20 and the epitaxial layer 22. The buffer layer 21 has the same conductivity type as the substrate 20 and the epitaxial layer 22. The doped concentration of the buffer layer 21 ranges between that of the substrate 20 and that of the epitaxial layer 22. The buffer layer 21 can reduce the on-state source/drain resistance (Rdson), thereby reducing the power consumption of the trench power semiconductor device 2.

Furthermore, in the embodiment shown in FIG. 2, by doping different conductivity type impurities in different regions and making the different regions have different concentrations, the epitaxial layer 22 can be divided into a drift region 220, a body region 221 and a source region 222. The body region 221 and the source region 222 are formed in the epitaxial layer 22 near to the sides of the trench gate structure 23. The drift region 220 is located closer to the substrate 20. That is to say, the body region 221 and the source region 222 are positioned at an upper portion of the epitaxial layer 22, and the drift region 220 is positioned at a lower portion of the epitaxial layer 22.

Specifically, the body region 221 is formed by implanting second conductivity type impurities into the epitaxial layer 22, and the source region 222 is formed by implanting first conductivity type impurities into the epitaxial layer 22. The source region 222 is located over the body region 221. For example, in NMOS, the body region 221 is doped with p-type impurities to form the p-well, and the source region 222 is doped with n-type impurities. Furthermore, the doping concentration of the body region 221 is less than that of the source region 222.

Furthermore, in the instant embodiment, the epitaxial layer 22 defines an active region AR and at least one termination region TR immediately adjacent to the active region AR. The body region 221 and the source region 222 are positioned in the active region AR. The epitaxial layer 22 has at least one cell trench 220a formed therein and positioned in the active region AR, and a termination trench 220 is formed therein and positioned in the termination region TR.

The cell trench 220 is a deep trench, i.e., the cell trench 220a extends from a surface of the epitaxial layer 22 into the drift region 220, and the bottom of the cell trench 220a is closer to the substrate 20. Furthermore, in the instant embodiment, the cell trench 220a is substantially divided into an upper portion and a lower portion by a reference plane at which the lowest edge of the body region 221 is located.

In the instant embodiment, at least one trench gate structure 23 is arranged in the corresponding cell trench 220a. Please refer to FIG. 2A, which illustrates an enlarged cross-sectional schematic view of trench gate structure 23 shown in FIG. 2. The trench gate structure 23 includes a shielding electrode 235, a first dielectric layer 231, a second dielectric layer 232, a third dielectric layer 233 and a gate electrode 234. The first, second and third dielectric layers 231, 232, 233 are sequentially stacked on an inner wall surface of the cell trench 220a and isolate the gate electrode 234 and the shielding electrode 235 from the epitaxial layer 22. The inner wall surface of the cell trench 220a includes two lateral surfaces and a bottom surface of the cell trench 220a.

Specifically, the first dielectric layer 231 conformingly covers the inner wall surfaces of the cell trench 220a and has a contour substantially similar to that of the inner wall surface of the cell trench 220a. Furthermore, the first dielectric layer 231 has a first upper inner wall 231a, a second upper inner wall 231c facing to the first upper inner wall 231a, and a lower inner wall 231b connecting between the first and second upper inner walls 231a, 231c. The second dielectric layer 232 at least covers the lower inner wall 231b of the first dielectric layer 231.

The thicknesses of the first and second dielectric layers 231, 232 can be determined based on the withstand voltage of the gate electrode 234 and the width of the gate electrode 234. For example, if the withstand voltage of the gate electrode 234 is set to range from 20 to 25V, the thickness of the first dielectric layer 231 ranges from 25 to 60 nm, and the thickness of the second dielectric layer 232 ranges from 200 to 250 nm.

The gate electrode 234 is arranged in the cell trench 220a and includes at least one first conductive layer 234a and a second conductive layer 234b disposed facing to each other. In another embodiment, the gate electrode 234 can include only one conductive layer, i.e., only includes the first conductive layer 234a or the second conductive layer 234b.

The first conductive layer 234a and the second conductive layer 234b respectively cover the first upper inner wall 231a and the second upper inner wall 231c. Furthermore, the bottom end of the first conductive layer 234a connects to a first ending surface 232a of the second dielectric layer 232, and the bottom end of the second conductive layer 234b connects to a second ending surface 232b of the second dielectric layer 232. Additionally, the first and second conductive layers 234a, 234b are insulated from the epitaxial layer 22 by the first dielectric layer 231.

In the instant embodiment, the first and second ending surface 232a, 232b are located at a level lower than or equal to the lowest edge of the body region 221. That is to say, the bottom ends of the first and second conductive layers 234a, 234b are both located lower than the lowest edge of the body region 221. As such, the inversion channels can be formed in the body region 221 closer to two sidewalls of the cell trench 220a when a bias is applied to the gate electrode 234. In another embodiment, the second dielectric layer 232 has a thickness substantially equal to that of the first and second conductive layers 234a, 234b.

The third dielectric layer 233 conformingly covers the inner surfaces of the first conductive layer 234a, the second dielectric layer 232, and the second conductive layer 234b. That is, the first conductive layer 234a, the second dielectric layer 232, and the second conductive layer 234b are commonly interposed between the first and third dielectric layers 231, 233.

In the instant embodiment, the second dielectric layer 232 is made of the material different from that of the first and third dielectric layers 231, 233. As such, the second dielectric layer 232 can be removed during a selective etching step without removing the first and third dielectric layers 231, 233. However, it is not necessary that the first dielectric layer 231 and the third dielectric layer 233 be made of the same material.

For example, both of the first and third dielectric layers 231, 233 can be oxide layers, and the second dielectric layer 232 can be a nitride layer. The oxide layer can be made of the any insulator with high dielectric, such as silicon oxide, aluminum oxide, zirconium oxide, hafnium oxide or yttrium oxide, and the nitride layer can be silicon nitride. However, as long as the same result can be achieved, the materials of the first, second and third dielectric layers 231 to 233 are not limited to the examples provided herein. In the instant embodiment, the thickness of the third dielectric layer 233 ranges from 100 to 300 nm.

The shielding electrode 235 is arranged in the cell trench 220a and insulated from the first and second conductive layers 234a, 234b.

Figure 2A:
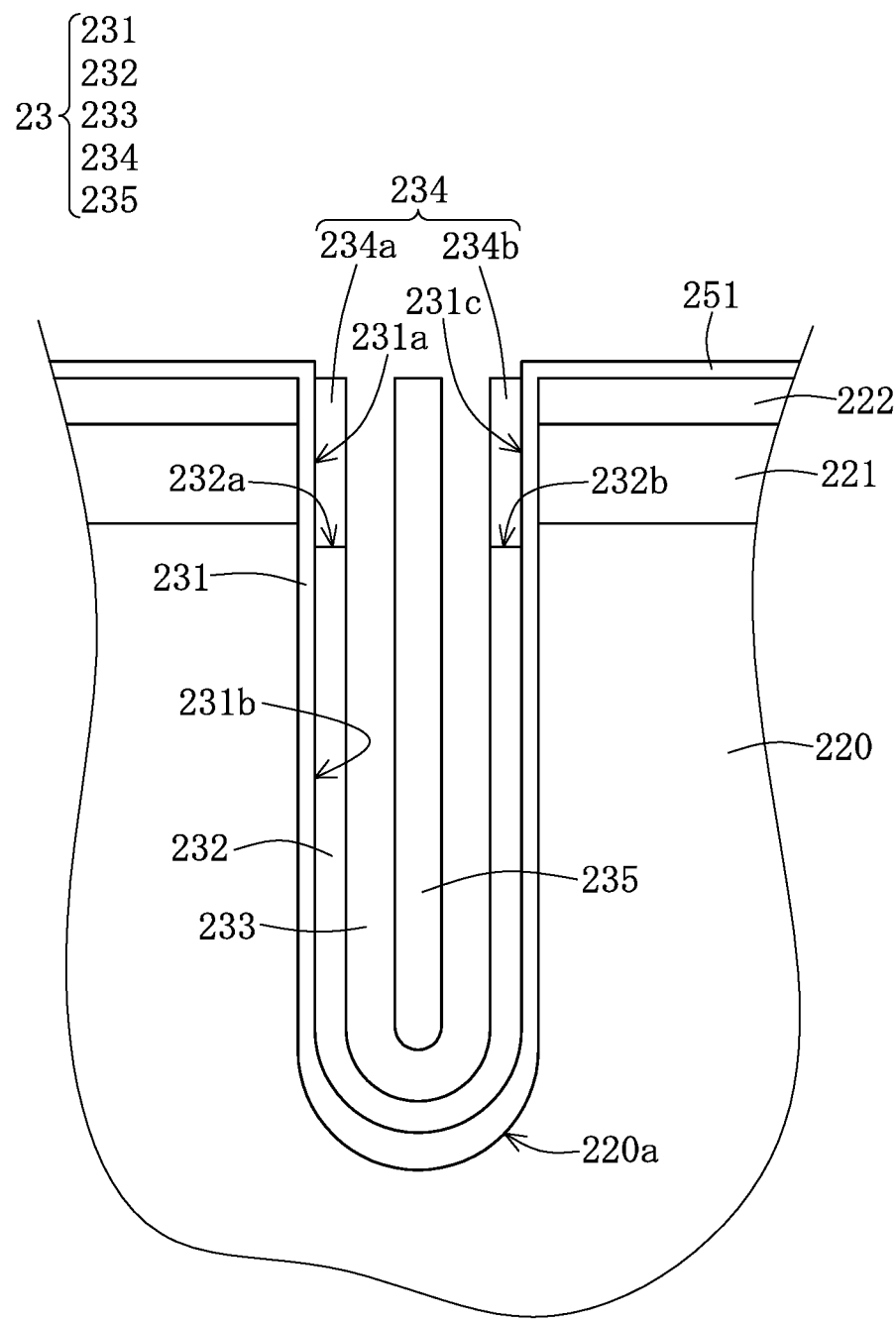
FIG. 2A shows an enlarged cross-sectional schematic view of the trench gate structure shown in FIG. 2.

Specifically, the shielding electrode 235 extends from the upper portion to the lower portion of the cell trench 220a, and the first and second conductive layers 234a, 234b are respectively located at two opposite sides of the shielding electrode 235. As shown in FIG. 2A, part of the shielding electrode 235 is disposed overlapping with the first and second conductive layers 234a, 234b in the depth direction, and the shielding electrode 235 is insulated from the first and second conductive layers 234a, 234b by two opposite ending portions of the third dielectric layer 233.

The cell trench 220a had a deep trench structure. The deep trench structure can result in higher breakdown voltage of the trench power semiconductor device 2. However, the deep trench structure also results in higher gate-to-drain capacitance (Cgd) and higher on-state source/drain resistance (Rdson). Accordingly, in the embodiment of the instant disclosure, the shielding electrode 235 is configured in the cell trench 220a to reduce the gate-to-drain capacitance and the switching losses. Furthermore, the shielding electrode 235 can be electrically connected to the source to improve the charge balance in the drift region 220, thereby improving the breakdown voltage. Accordingly, the doped concentration of the drift region 220 can be increased to reduce the on-state source/drain resistance.

Figure 2B:
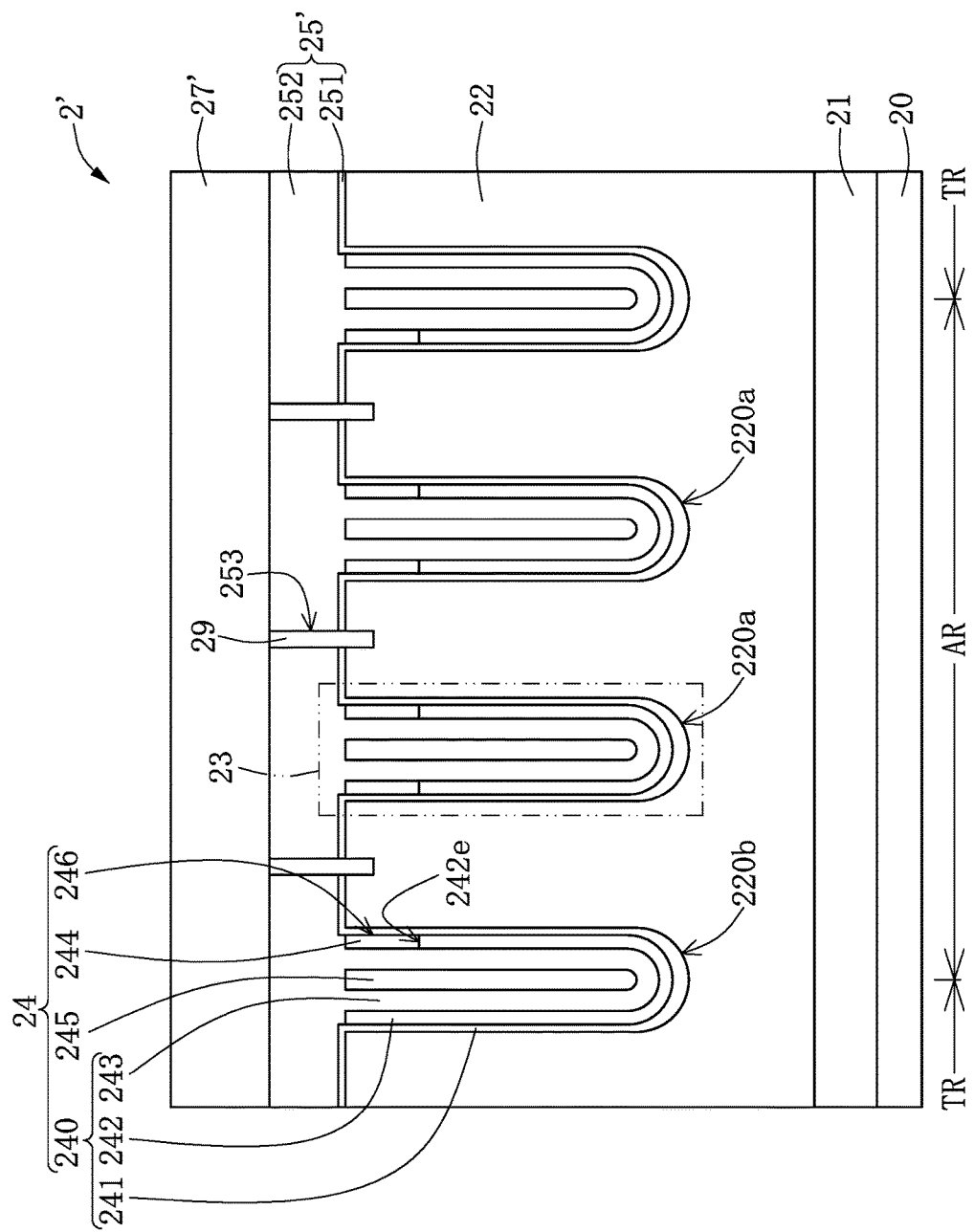
FIG. 2B shows a cross-sectional schematic view of a trench power semiconductor device in accordance with another embodiment of the instant disclosure.

Referring to FIG. 2B, the terminal electrode structure 24 is arranged in the termination trench 220b, and includes a terminal electrode 245, a terminal dielectric layer 240 and a conductive layer 244. The terminal electrode 245 is insulated from the conductive layer 244 and the epitaxial layer 22 by the terminal dielectric layer 240.

Specifically, the terminal electrode 245 extends from an upper portion to a lower portion of the termination trench 220b. The terminal dielectric layer 240 conformingly covers an inner wall surface of the termination trench 220b and has a contour substantially similar to that of the inner wall surface. The terminal dielectric layer 240 includes a first insulating layer 241, a second insulating layer 242, and a third insulating layer 243.

The first, second, and third insulating layers 241 to 243 are sequentially stacked on the inner wall surface of the termination trench 220b. That is to say, the second insulating layer 242 is interposed between the first and third insulating layers 241, 243. In the instant embodiment, the second insulating layer 242 is a different material than the first insulating layer 241. For example, the first insulating layer 241 can be made of silicon oxide, and the second insulating layer 242 can be made of silicon nitride.

The second insulating layer 242 has an end face 242e, which is depressed from the top surfaces of the first and third insulating layers 241, 243 to define a recess 246 among the first, second and third insulating layers 241 to 243. Since the material of the second insulating layer 242 is different from that of the first and third insulating layers 241, 243, the recess 246 can be formed by performing a selective etching step. Moreover, the end face 242e of the second insulating layer 242 is located lower than a top of the terminal electrode 245.

The conductive layer 244 is arranged in the recess 246 and the bottom of the conductive layer 244 connects the end face 242e of the second insulating layer 242. Schematically, the conductive layer 244 and the terminal electrode 245 are arranged in the termination trench 220b and parallel to each other. Part of the terminal electrode 245 overlaps with the conductive layer 244 in depth direction. Furthermore, conductive layer 244 and the terminal electrode are isolated from each other by the third insulating layer 243. In one embodiment, the conductive layer 244 has substantially the same thickness as the second insulating layer 242. The conductive layer 244 can be electrically connected to the source or the gate and configured in conjunction with the terminal electrode 245 to improve the breakdown voltage of the trench power semiconductor device 2.

The first insulating layer 241 can be made of the same material as the first dielectric layer 231, and deposited in the same process of forming the first dielectric layer 231. Similarly, the second insulating layers 242 can be made of the same material as the second dielectric layer 232, and the third insulating layers 243 can be made of the same material as the second dielectric layer 233. The second dielectric layer 232 and the second insulating layer 242 can be formed during the same process, and the third dielectric layer 233 and the third insulating layer 243 can be formed during the same process. Accordingly, the first dielectric layer 231 can have the same thickness as the first insulating layer 241, the second dielectric layer 232 can have the same thickness as the second insulating layer 242, and the third dielectric layer 233 can have the same thickness as the third insulating layer 243.

Please refer to FIG. 2 again. The trench power semiconductor device 2 further includes an interlayer dielectric layer 25, a source conductive plug 26, and a source contact 27.

The interlayer dielectric layer 25 is disposed on the epitaxial layer 22 and includes a passivation layer 251 and a planar film 252. In the instant embodiment, the passivation layer 251 is directly disposed on the surface of the epitaxial layer 22 and made of the same material as the first dielectric layer 231. That is, the first dielectric layer 231 and the passivation layer 251 can be both made of oxide, and formed during the same deposition process. The process will be explained in detail following and is omitted here.

In another embodiment, the passivation layer 251 can be made of a different material from that of the first dielectric layer 231 and the instant disclosure is not limited to the material of the passivation layer 251. The planar film 252 is disposed on the passivation layer 251 and can be made of borophosphosilicate glass (BPSG), phosphosilicate glass (PSG), oxide, nitride or the combination thereof.

Moreover, the interlayer dielectric layer 25 has at least one source contact opening 250 formed therein. In the instant embodiment, the source contact opening 250 extends from an upper surface of the interlayer dielectric layer 25 into the epitaxial layer 22, and the source contact opening 250 is formed near to one side of the source region 222. The epitaxial layer 22 includes a contact doping region 223 formed at the bottom of the source contact opening 250. In one embodiment, the contact doping region 223 is formed by performing a $BF^{2+}$ ion implantation in the epitaxial layer 22 through the source contact opening 250.

However, the position of the source contact opening 250 is adjustable according to the design of the device and not limited to the embodiment provided herein. In another embodiment, the source contact opening 250 can be formed in alignment with the position of the source region 222.

The source conductive plug 26 is formed in the source contact opening 250 to be electrically connected to the source region 222. Specifically, the source conductive plug 26 passes through the source contact opening 250 to be in contact with the source region 222 and the contact doping region 250 in the epitaxial layer 22, thereby forming an ohmic contact between the source conductive plug 26 and the source region 222. The source conductive plug 26 can be made of metal, such as, but not limited to, tungsten, copper, nickel, or aluminum.

The source contact 27 covering the planar film 252 is electrically connected to the source region 222 by the source conductive plug 26 penetrating the interlayer dielectric layer 25. That is, the source contact 27 can serve as a source electrode and be electrically connected to an external circuit. The source contact 27 can be made of titanium, titanium nitride, tungsten, Al—Si alloy, or Al—Cu—Si alloy, and so on, but the examples provided herein do not intend to limit the instant disclosure.

The trench gate structure 23 and the terminal electrode structure 24 shown in FIG. 2 also can be implemented in another trench power semiconductor device 2', which has at least one schottky diode integrated therein.

Please refer to FIG. 2B. Specifically, in the trench power semiconductor device 2', the body region and the source region are omitted. Furthermore, the trench power semiconductor device 2' also includes an interlayer dielectric layer 25', a conductive plug 29 and a pad 27'.

The pad 27' is electrically connected to the epitaxial layer 22 through the conductive plug 29 to form the schottky diode. Specifically, the interlayer dielectric layer 25' has at least one schottky contact opening 253 (more than one schottky contact openings 253 are shown in FIG. 2B) formed therein, and the conductive plug 29 passes through the corresponding schottky contact opening 253 and penetrates the interlayer dielectric layer 25' and a portion of the epitaxial layer 22 to be electrically connected to the epitaxial layer 22 between two adjacent cell trenches 220a.

Accordingly, the trench gate structure 23 and the terminal electrode structure 24 provided in the instant disclosure are not only able to be applied in the power transistor device.

The manufacturing method of the trench power semiconductor device 2 in accordance with another embodiment will be described in the following description.

Figure 3A:
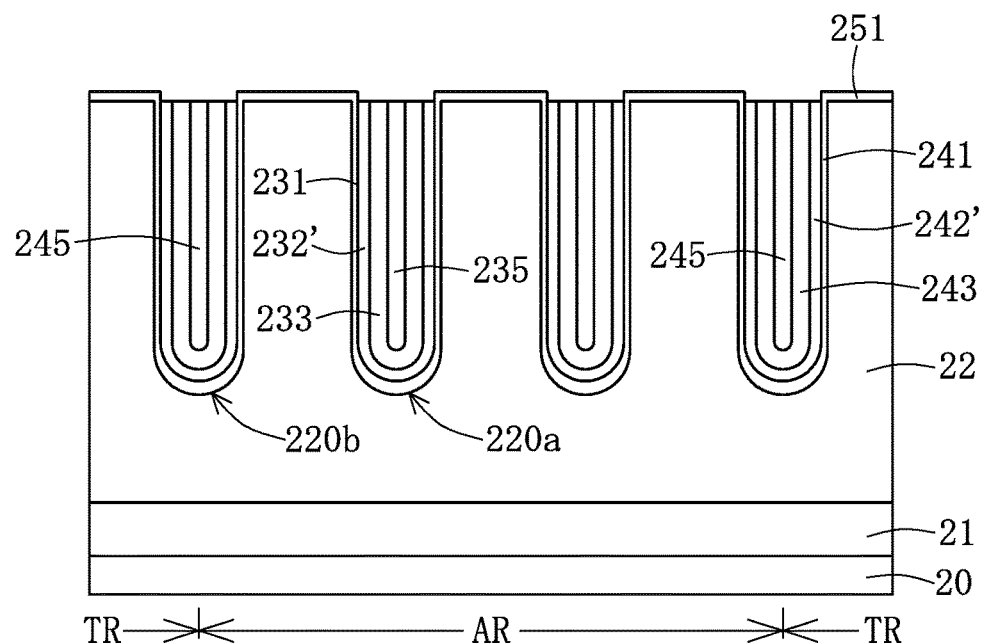
FIGS. 3A to 3E respectively shows cross-sectional schematic views of a trench power semiconductor device in different steps in accordance with an embodiment of the instant disclosure.

As shown in FIG. 3A, the buffer layer 21 and the epitaxial layer 22 have been formed on the substrate 20. The epitaxial layer 22 defines an active region AR and a termination region TR. In addition, at least one cell trench 220 positioned in the active region AR and at least one termination trench 220b positioned in the termination region TR are formed in the epitaxial layer 22. In one embodiment, each of the cell trench 220a and the termination trench 220b has a depth ranging from 2 to 6 μm.

Moreover, the first dielectric layer 231, a second dielectric material 232', and the third dielectric layer 233 are sequentially fabricated on the inner wall surface of the cell trench 220a. The first insulating layer 241, a second insulating material 242', and the third insulating layer 243 are fabricated on the inner wall surface of the termination trench 220b.

In the instant embodiment, the second dielectric material 232' is different from the materials of the first and third dielectric layers 231, 233. As long as the second dielectric material 232' can be removed without removals of the first and third dielectric layers 231, 233, i.e., a selective etching step can be carried out, the materials of the first and third dielectric layer 231, 233 are not limited in the instant disclosure. Similarly, the second insulating material 242' is different from the materials of the first and third insulating layers 241, 243 or the materials of the first and third dielectric layer 231, 233.

The passivation layer 251 also has been formed on the surface of the epitaxial layer 22. The passivation layer 251, the first dielectric layer 231, and the first insulating layer 241 can be deposited by physical vapor deposition or chemical vapor deposition. In one embodiment, both of the first dielectric layer 231 and the first insulating layer 241 can be silicon oxide (SiO$_x$) and formed by thermal oxidation process.

Similarly, the second dielectric material 232' and the second insulating material 242' also can be fabricated during the same process. When the first dielectric layer 231 and the first insulating layer 241 are silicon oxide layer, the second dielectric material 232' and the second insulating material 242' can be nitride, such as silicon nitride. Additionally, the third dielectric layer 233 and the third insulating layer 243 can be made of silicon dioxide (SiO$_2$).

As illustrated in FIG. 3A, the shielding electrode 235 and the terminal electrode 245 have been fabricated and respectively arranged in the cell trench 220a and the termination trench 220b. Specifically, a polysilicon layer is blanketly formed on the epitaxial layer 22, and the cell trench 220a and the termination trench 220b are filled with the polysilicon layer. The polysilicon layer can be doped with conductivity type impurities, i.e., doped poly-Si. Subsequently, a portion of the polysilicon layer covering the surface of the epitaxial layer 22 is removed by an etching back process, and the shielding electrode 235 and the terminal electrode 245 are respectively remained in the cell trench 220a and the termination trench 220b.

Figure 3B:
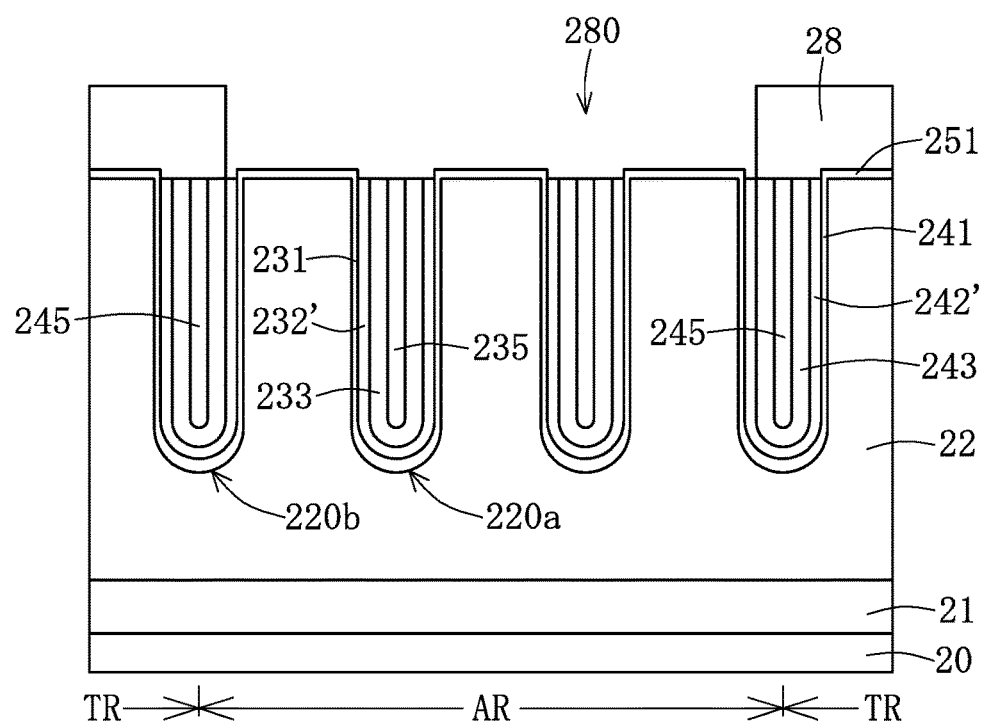

Please refer to FIG. 3B. Subsequently, a photoresist layer 28 is formed on the epitaxial layer 22 for covering the termination region TR. The photoresist layer 28 has an opening 280 formed therein to expose the active region AR and a portion of the second insulating material 242', which is positioned in the termination trench 220b and closer to the active region AR. Furthermore, in the instant embodiment, the photoresist layer 28 covers the terminal electrode 245 arranged in the termination trench 220b.

Figure 3C:
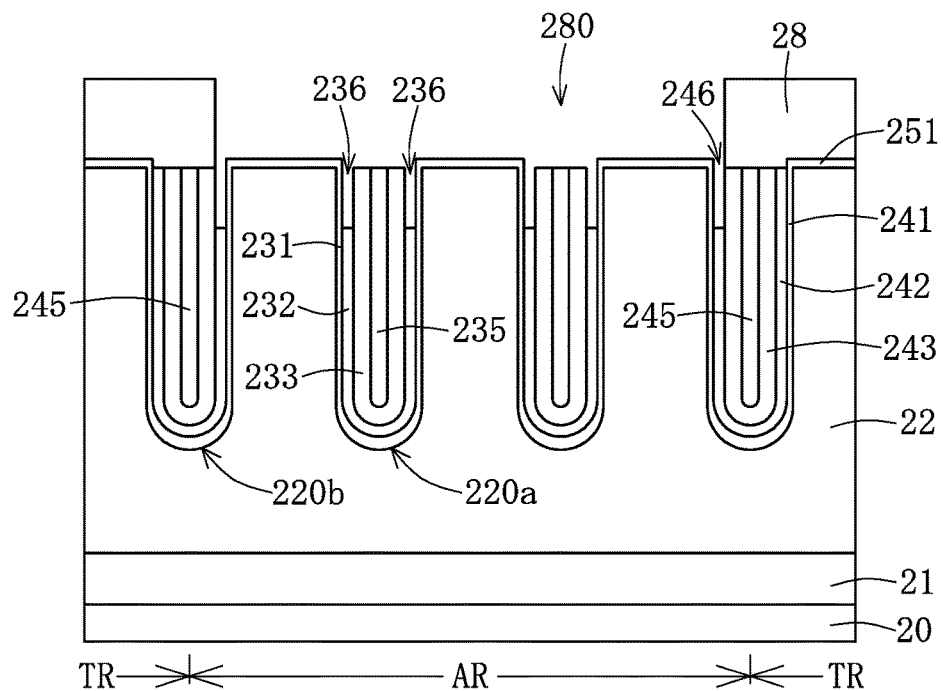

Please refer to FIG. 3C. A selective etching step is performed through the opening 280 to remove a portion of the second dielectric material 232' positioned at the upper portion of the cell trench 220a, and a portion of the second insulating material 242' positioned at the upper portion of the termination trench 220b, thereby forming the second dielectric layer 232 and the second insulating layer 242 shown in FIG. 2.

The selective etching step can be a wet etching process, and a chemical etchant having higher selectivity toward the second dielectric material 232' and the second insulating material 242' is chosen. Thus, the first and third dielectric layers 231, 233, and the first insulating layer 241 can be remained during the removals of the portions of the second dielectric material 232' and the second insulating material 242'.

As shown in FIG. 3C, after the selective etching step, at least one first recess 236 is formed in the cell trench 220a, and a recess 246 is formed in the termination trench 220b. That is, the first and third dielectric layers 231, 233 formed in the cell trench 220a and the first insulating layer 241 can serve as a mask so that the positions and the shapes of the first recess 236 and the recess 246 can be respectively defined.

Figure 3D:
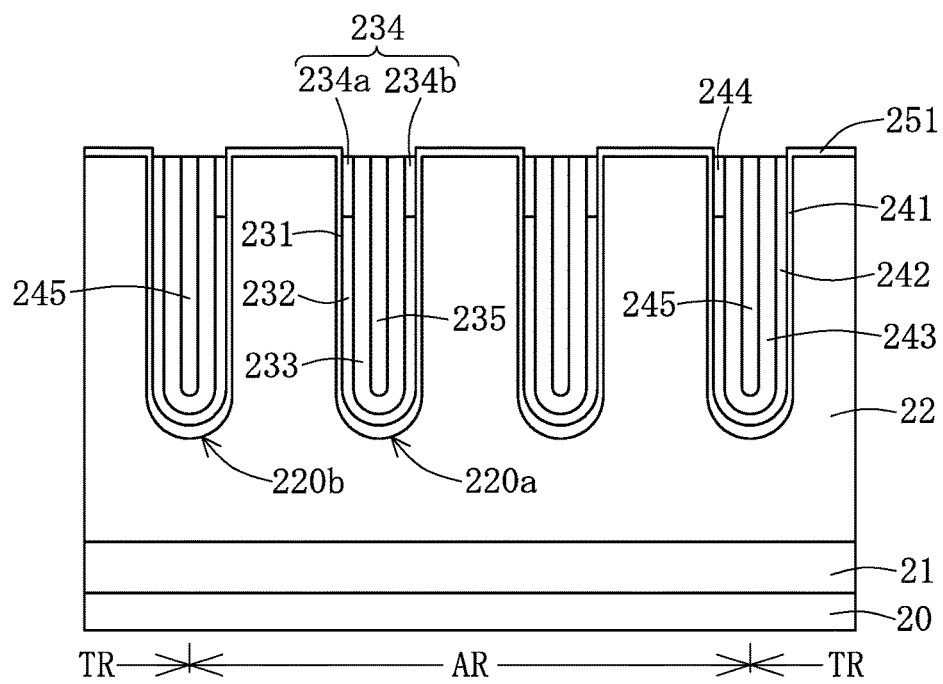

Please refer to FIG. 3D. After the photoresist layer 28 is removed, a first conductive layer 234a and a second conductive layer 234b are formed in the cell trench 220a, and a conductive layer 244 is formed in the termination trench 220b. In one embodiment, a polysilicon material is formed by blanket deposition on the surface of the epitaxial layer 22 and fills into the first recess 236 and the recess 246, and then is etched back to remove a portion of the polysilicon material on the surface of the epitaxial layer 22. Another portion of the polysilicon material is left in the first recess 236 and the recess 246, so that the first and second conductive layers 234a, 234b, i.e., the gate electrode 234 of the trench power semiconductor device 2 shown in FIG. 2, are formed in the cell trench 220a, and the conductive layer 244 is formed in the termination trench 220b.

As shown in FIG. 3C, the positions and shapes of the gate electrode 234, which includes the first and second conductive layers 234a, 234b, and the conductive layer 244 can be defined in advance by performing the selective etching step to form the first recess 236 and the recess 246.

In the embodiment of the instant disclosure, the third dielectric layer 233 or the third insulating layer 243 are not formed by oxidizing the shielding electrode 235 and the terminal electrode 245 through the thermal oxidation process. Therefore, compared to prior art, the third dielectric layer 233 and the third insulating layer 243 have better thickness uniformity.

In addition, the cell trench 220a usually has too narrow openings to accurately define the positions and shapes of the two first recesses 236 in the same cell trench 220a even though the photoresist is used.

Compared with the prior art, in the manufacturing method provided herein, the second dielectric material 232' can help to define two first recesses 236 in the same cell trench 220a and the photoresist can be omitted during the selective etching step. Furthermore, since the first and third dielectric layers 231, 233 are not laterally etched during the selective etching step, the first conductive layer 234a (or the second conductive layer 234b) formed in the first recess 236 can be insulated from the shielding electrode 235 through the third dielectric layer 233 and insulated from the epitaxial layer 22 through the first dielectric layer 231.

As such, during the fabrication of the conductive layer 244, the first conductive layer 234a, and the second conductive layer 234, the first conductive layer 234a and the second conductive layer 234b have no point portion formed at the bottom sides thereof, closer to the shielding electrode 235, thereby preventing the electrical property of the device from being affected by the point effect and improving the withstand voltage of the gate electrode 234. Moreover, the third dielectric layer 233 has a relatively thicker thickness ranging from 100 to 300 nm. Thus, the capacitance between the gate electrode and the shielding electrode (electrically connected to source) can be reduced, thereby increasing the switching speed of the trench power semiconductor device.

Figure 3E:
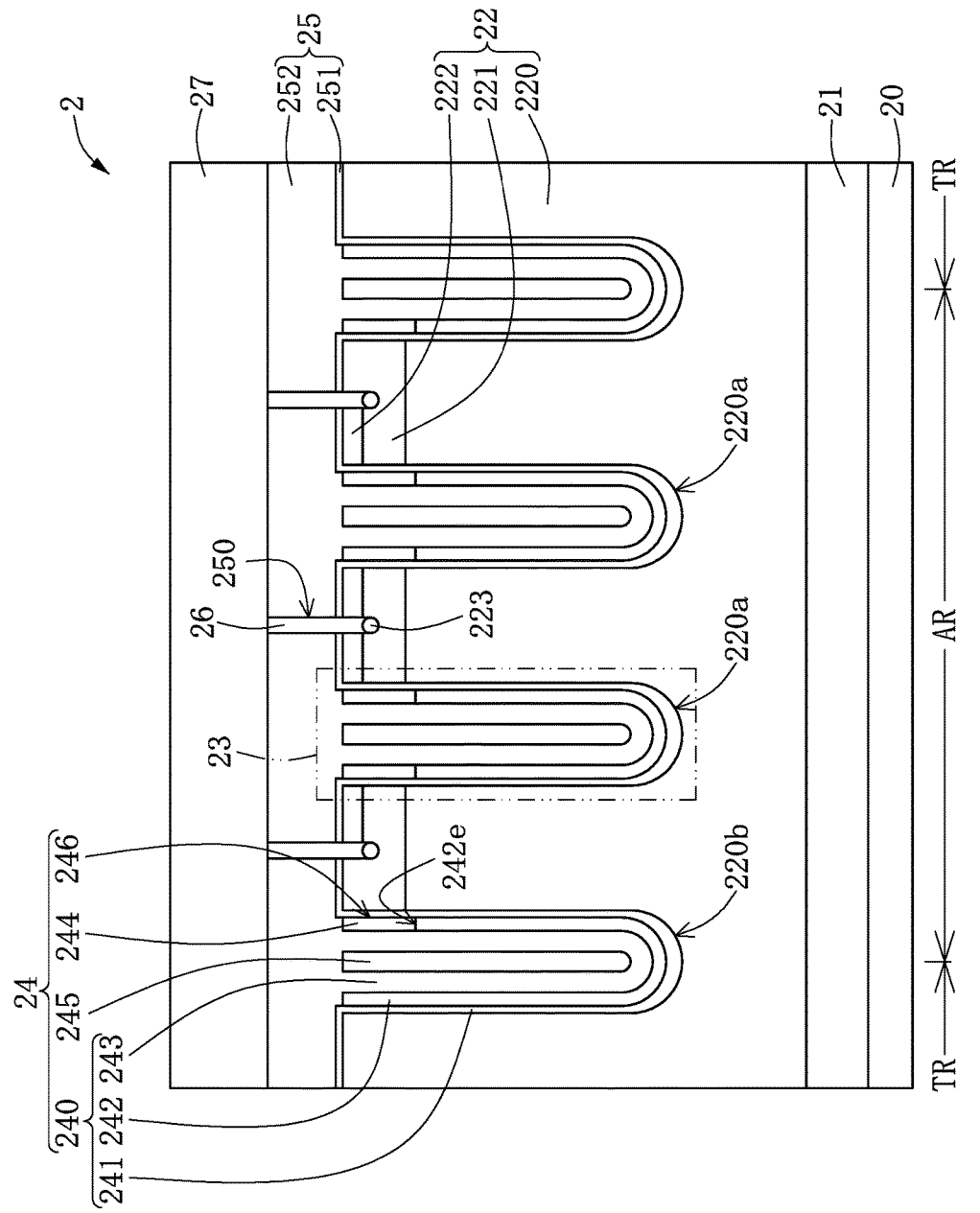

Please refer to FIG. 3E. A base implantation process and a source implantation process are performed to form a source region 222 and a body region 221 at a side of the epitaxial layer 22 away from the substrate 20, and the source region 222 is located over the body region 221. The source implantation process can include an ion implantation and a thermal diffusion step. As shown in FIGS. 2A and 3E, the lowest edge of the body region 221 is located at a level higher than the first ending surface 232a and the second ending surface 232b of the second dielectric layer 232.

Subsequently, a redistribution layer is formed on the epitaxial layer 22 so that the source region 222, the gate electrode 234 and the shielding electrode 235 can be electrically connected to an external control circuit. In the instant embodiment, taking the source conductive plug shown in FIG. 2 as an example to describe the steps of the formation of the redistribution layer in detail. Firstly, a planar film 252 is formed by blanket deposition to cover the passivation layer 251, the trench gate structure 23 and the terminal electrode structure 24. The planar film 252 can be made of borophosphosilicate glass (BPSG), phosphosilicate glass (PSG), oxide, nitride or the combination thereof.

Subsequently, at least one source contact opening 250 (three source contact openings 250 are shown in FIG. 3E) corresponding to the position of the source region 222 is formed. In this embodiment, the formation of the source contact opening 250 can be carried out by a traditional coating photoresist step, a lithography step, and an etching step. Thereafter, the source conductive plug 26 is formed in the corresponding source contact opening 250. That is, the source conductive plug 26 penetrates the planar film 252 and the passivation layer 251 and extends into the epitaxial layer 22 near one side of the source region 222 to electrically connect the source region 222. Before the fabrication of the source conductive plug 26 in the corresponding source contact opening 250, a doping process can be performed on the epitaxial layer 22 through the source contact opening 250 to form a contact doping region 223. In one embodiment, the contact doping region 223 is doped with $BF^{2+}$ ions.

Additionally, after the formation of the source conductive plug 26 in the corresponding source contact opening 250, a source contact 27 can be formed on the planar film 252 and electrically connected to the source conductive plug 26. The source contact 27 also can be electrically connected to the external control circuit. The source contact 27 can be made of titanium, titanium nitride, tungsten, Al—Si alloy, or Al—Cu—Si alloy, and so on, but the examples provided herein do not intend to limit the instant disclosure.

Accordingly, the source contact 27 can be electrically connected to the source region 222 and the contact doping region 223 through the source conductive plug 26. Furthermore, the shielding electrode 235 and the terminal electrode 245 also can be electrically connected to the source contact 27 through other conductive plugs (not shown). The processes for electrically connecting the source region 222, the shielding electrode 235 and the terminal electrode 245 to the source contact 27 can be performed simultaneously. After the above descriptions, one of ordinary skill in the art should easily understand the other details in the process that are omitted herein.

Figure 4:
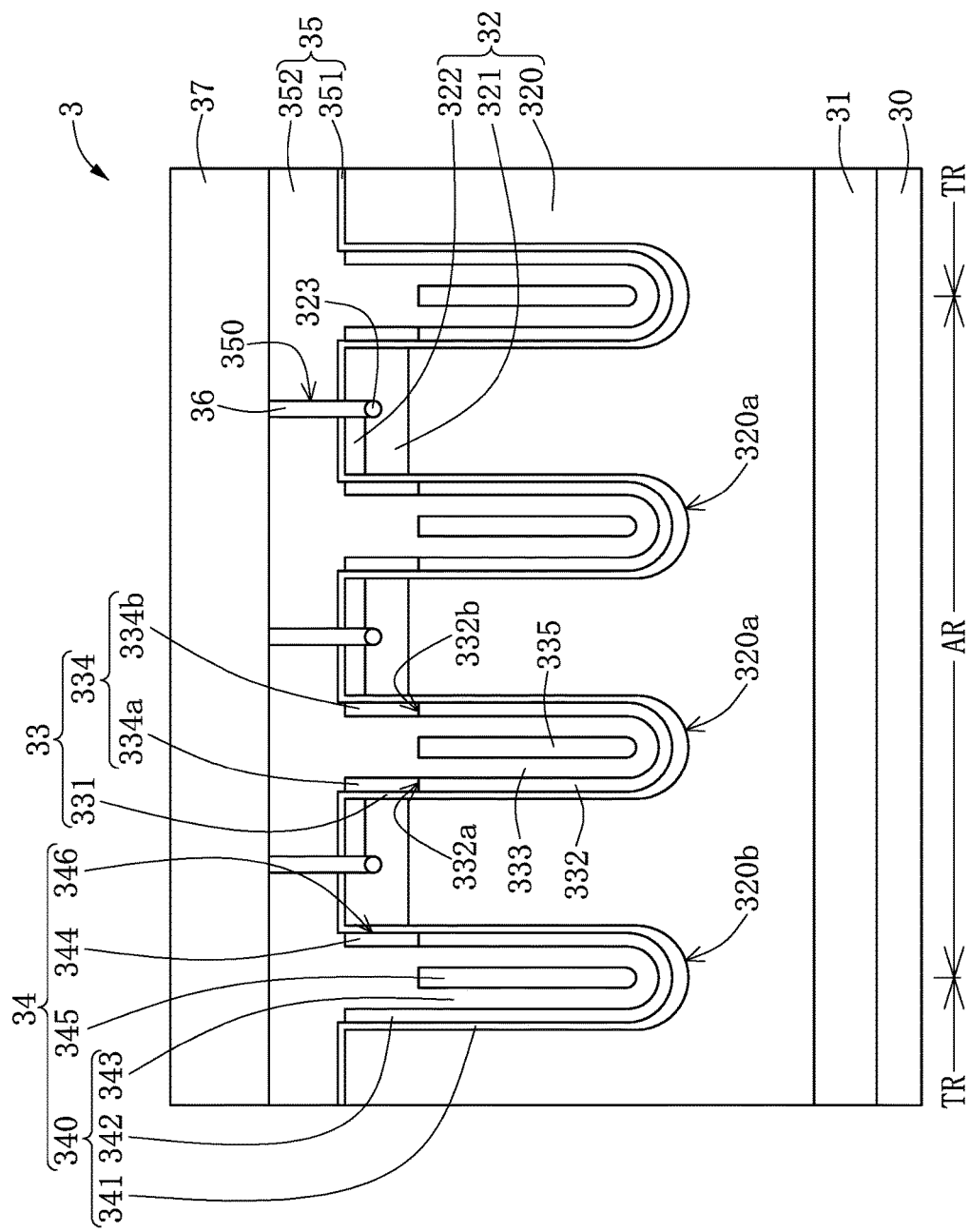
FIG. 4 shows a cross-sectional schematic view of a trench power semiconductor device in accordance with another embodiment of the instant disclosure.

Please refer to FIG. 4. In the trench power semiconductor device 3 of the instant embodiment, the shielding electrode 335 does not overlap either the first conductive layer 334a or the second conductive layer 334b. That is, the shielding electrode 335 is only positioned in the lower portion of the cell trench 320a. In the instant embodiment, the top of the shielding electrode 335 is located at a level lower than the lowest edge of the body region 321. Additionally, the third dielectric layer 333 completely encloses the shielding electrode 335 and isolates the first conductive layer 334a from the second conductive layer 334b.

In the instant embodiment, since the gate electrode 334 and the shielding electrode 335 do not overlap with each other, there is no capacitive coupling between the gate electrode 334 and the shielding electrode 335 and thereby improve the switching speed of the trench power semiconductor device 3.

Furthermore, the terminal electrode 345 does not overlap with the conductive layer 344 in the terminal electrode structure 34. Specifically, the terminal electrode 345 is positioned only at the lower portion of the termination trench 320b and completely enclosed by the third insulating layer 343.

Figure 4A:
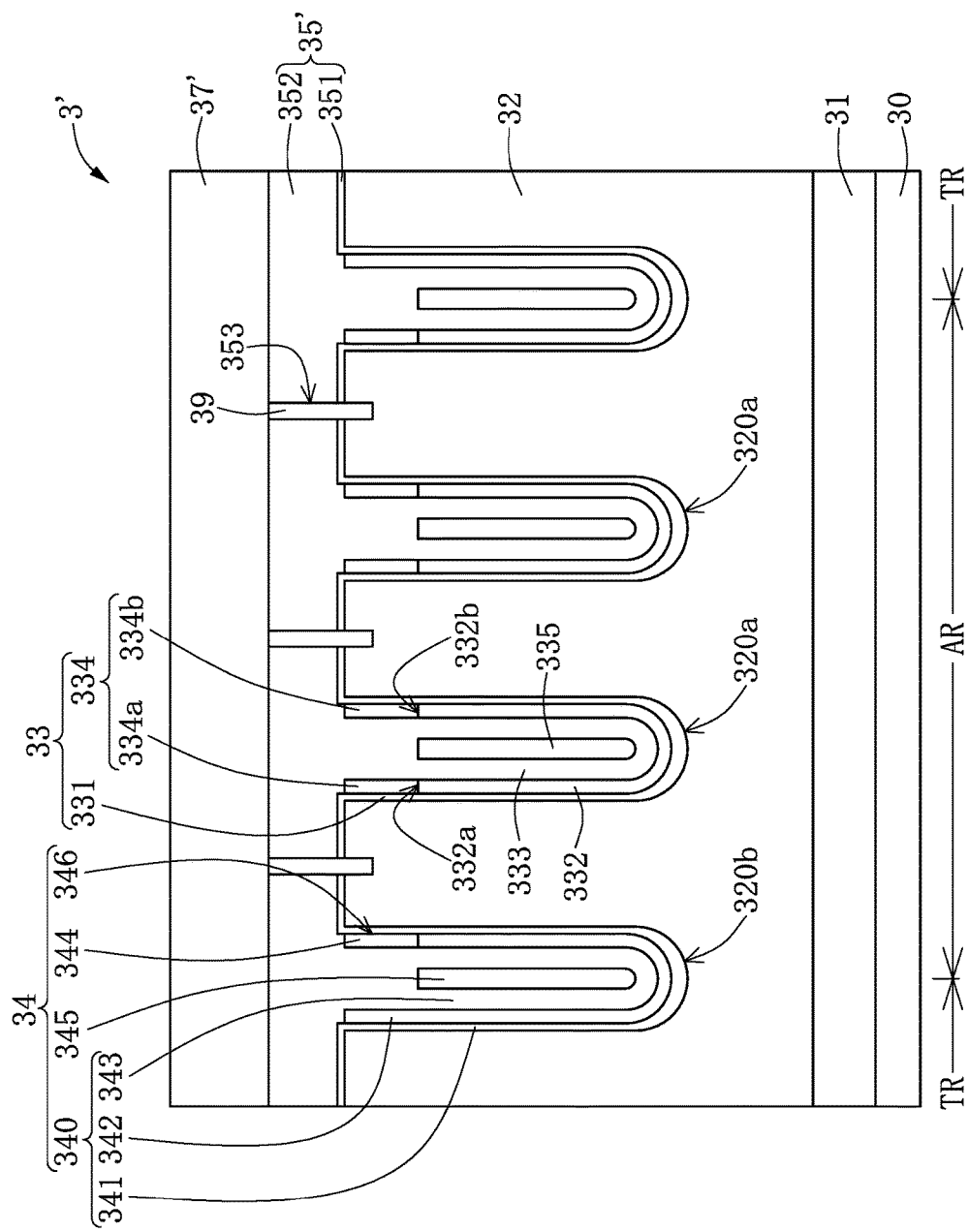
FIG. 4A shows a cross-sectional schematic view of a trench power semiconductor device in accordance with another embodiment of the instant disclosure.

Please refer to FIG. 4A, which illustrates that the trench gate structure 33 and terminal electrode structure 34 shown in FIG. 4 also can be integrated in the trench power semiconductor device 3' with the schottky diode. The structure of the schottky diode is the same as the embodiment shown in FIG. 2B and so description is omitted herein.

Additionally, the manufacturing method of the trench power semiconductor device 3 shown in FIG. 4 is substantially similar to that of the embodiment shown in FIGS. 3A to 3E. Particularly, during the selective etching step, the first dielectric layer 331 and the third dielectric layer 333 can serve as a mask to define the positions and shapes of the gate electrode 334 and conductive layer 344.

Figure 5:
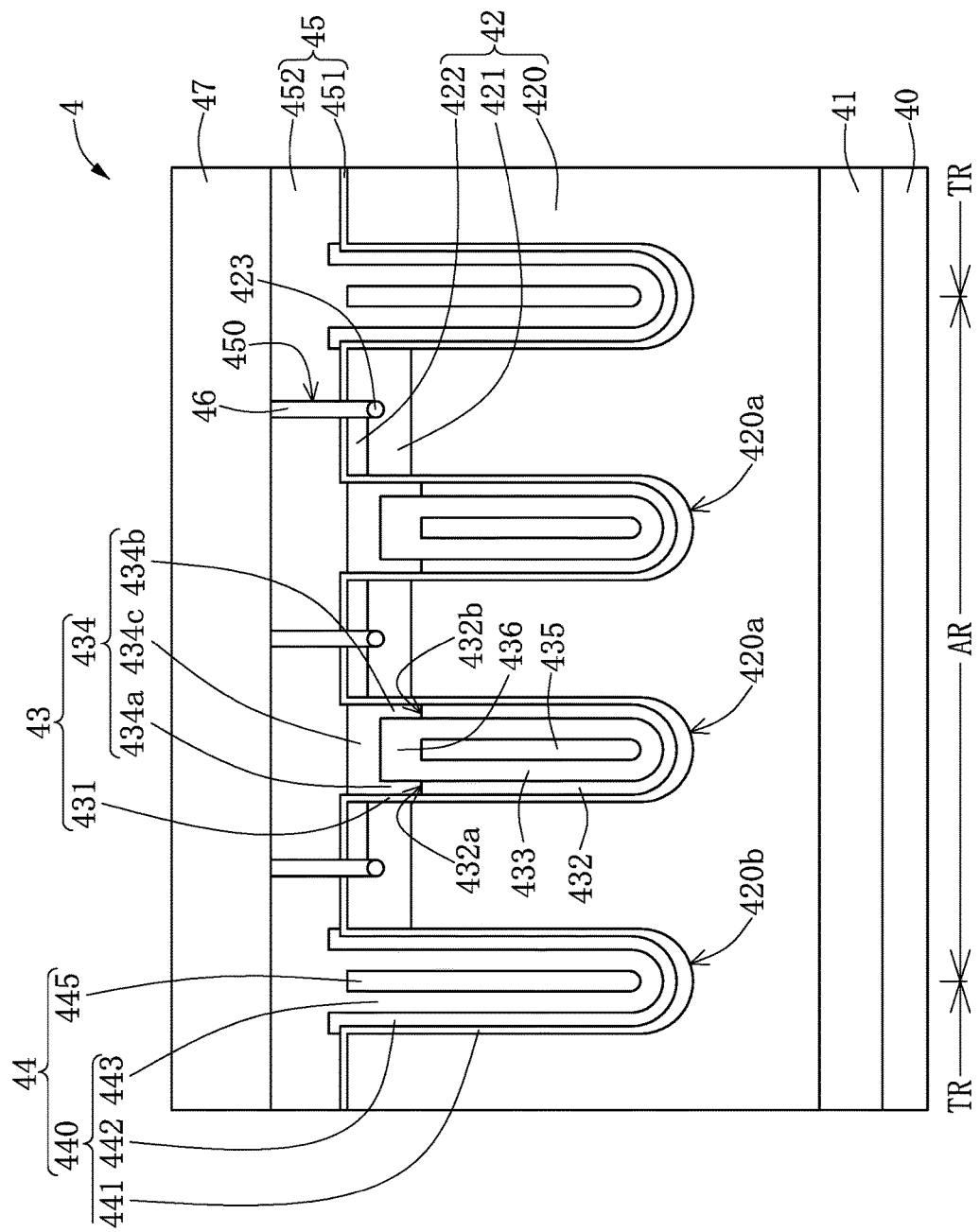
FIG. 5 shows a cross-sectional schematic view of a trench power semiconductor device in accordance with another embodiment of the instant disclosure.

Subsequently, as shown in FIG. 5, the gate electrode 43 of the trench gate structure 43 further includes a third conductive layer 434c, which extends between the first conductive layer 434a and the second conductive layer 434b. The third conductive layer 434c is disposed on and insulated from the shielding electrode 435.

In the instant embodiment, the shielding electrode 435 is positioned at the lower portion of the cell trench 420a and overlaps with neither the first conductive layer 434a nor the second conductive layer 434b. Specifically, the top of the shielding electrode 435 is located at a level lower than the lowest edge of the body region 421.

Furthermore, the trench gate structure 43 can further include an inter-electrode dielectric layer 436 so as to isolate the shielding electrode 435 from the third conductive layer 434c. The inter-electrode dielectric layer 436 can be made of, but is not limited to, oxide, such as silicon oxide, nitride, such as silicon nitride, or the other insulators.

In the instant embodiment, the bottom ends of the first conductive layer 434a and the second conductive layer 434b respectively connect the first ending surface 432a and the second ending surface 432b of the second dielectric layer 432. In addition, the first and second conductive layers 434a, 434b are interposed between the inter-electrode dielectric layer 436 and the first dielectric layer 431. The second dielectric layer 432 is made from a different material than the inter-electrode dielectric layer 436 so that the positions of the first and second conductive layers 434a, 434b can be defined by the selective etching step.

In one preferred embodiment, the second dielectric layer 432 is also made from a different material than the third dielectric layer 433. However, the materials of the second dielectric layer 432 and the third dielectric layer 433 are not limited to be different in the instant disclosure.

The terminal electrode structure 44 of the instant embodiment does not include any conductive layer and is different in structure from the previous embodiments, i.e., the terminal electrode structures 24, 34 respectively shown in FIG. 2 and FIG. 3. Specifically, in the instant embodiment, the terminal electrode structure 44 includes the terminal electrode 445 and terminal dielectric layer 440, and the terminal electrode 445 is insulated from the epitaxial layer 42 by the terminal dielectric layer 440. The terminal dielectric layer 440 includes a first insulating layer 441, a second insulating layer 442 and a third insulating layer 443, which are sequentially stacked on the inner wall surface of the termination trench 420b. The second insulating layer 442 completely covers the inner lateral surface of the first insulating layer 441. The terminal electrode 445 extends from the upper portion to the lower portion of the termination trench 420b.

Figure 5A:
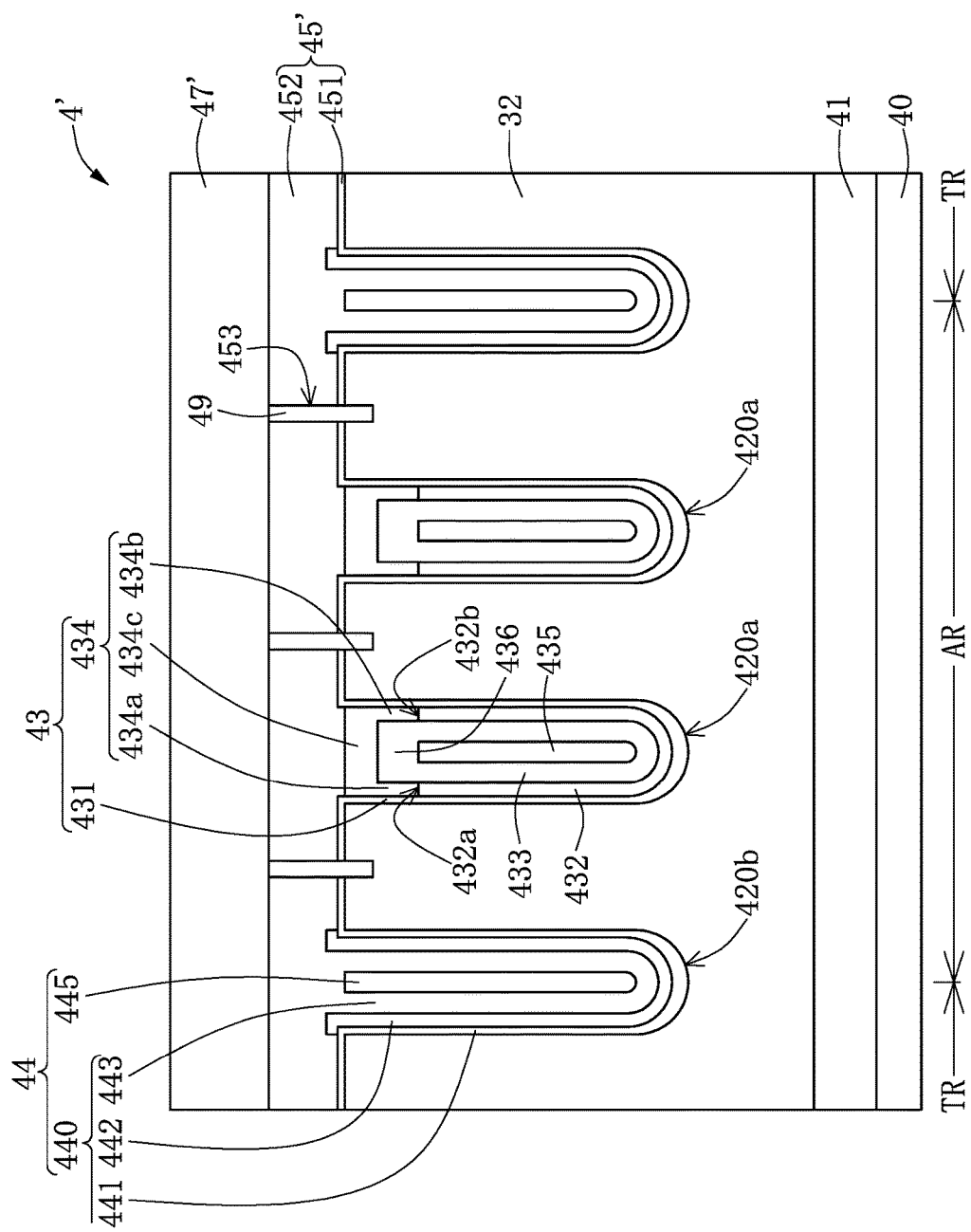
FIG. 5A shows a cross-sectional schematic view of a trench power semiconductor device in accordance with another embodiment of the instant disclosure.

Please refer to FIG. 5A, which illustrates that the trench gate structure 43 and terminal electrode structure 44 shown in FIG. 5 also can be integrated in the trench power semiconductor device 4' including the schottky diode. The structure of the schottky diode is the same as the embodiment shown in FIG. 2B and so the description omitted herein.

Please refer to FIG. 6A to FIG. 6E. Specifically, the trench power semiconductor device 4 can be fabricated by performing the manufacturing processes shown in FIG. 6A to FIG. 6E.

Figure 6A:
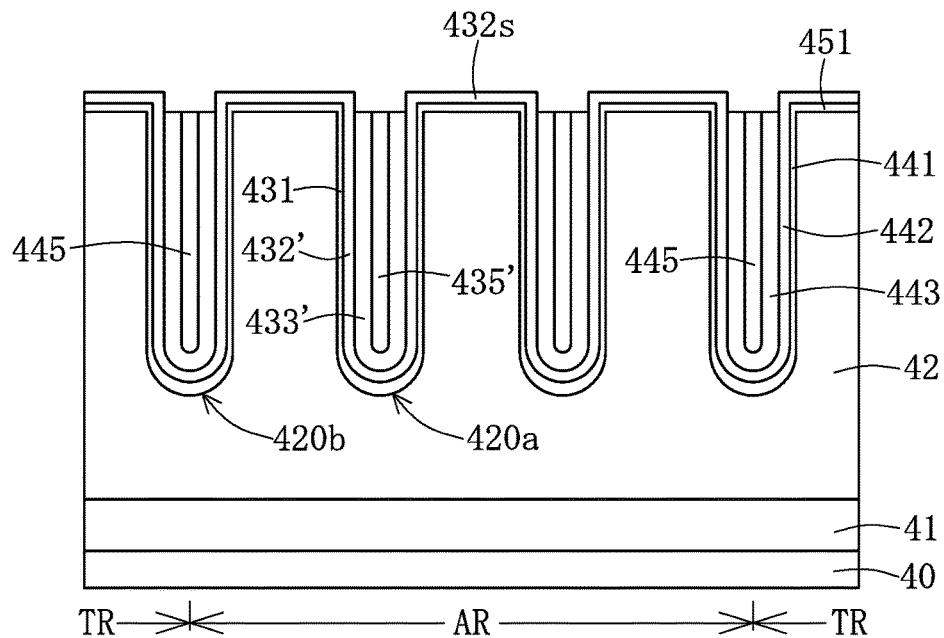
FIGS. 6A to 6E respectively shows cross-sectional schematic views of a trench power semiconductor device in different steps in accordance with an embodiment of the instant disclosure.

As shown in FIG. 6A, the buffer layer 41 and the epitaxial layer 42 are formed on the substrate 40 and the epitaxial layer 42 has at least one cell trench 420a formed therein and located at the active region AR, and at least one termination trench 420b formed therein and located at the termination region TR.

The first dielectric layer 431, a second dielectric material 432', a third dielectric material 433', and a polysilicon structure 435' are sequentially formed in the cell trench 420a. Similarly, the first insulating layer 441, the second insulating layer 442, the third insulating layer 443, and the terminal electrode 445 are formed in the termination trench 440b. In the instant embodiment, the terminal electrode 445 extends from the upper portion to the lower portion of the termination trench 420b.

As shown in FIG. 6A, the passivation layer 451 also has been formed on the surface of the epitaxial layer 42, and a hard mask 432s is formed on the passivation layer 451. The passivation layer 451, the first dielectric layer 431, and the first insulating layer 441 can be made of the same material and be fabricated during the same process. The hard mask 432s, the second dielectric material 432' and the second insulating layer 442 can be made of the same materials and be fabricated during the same deposition process.

Figure 6B:
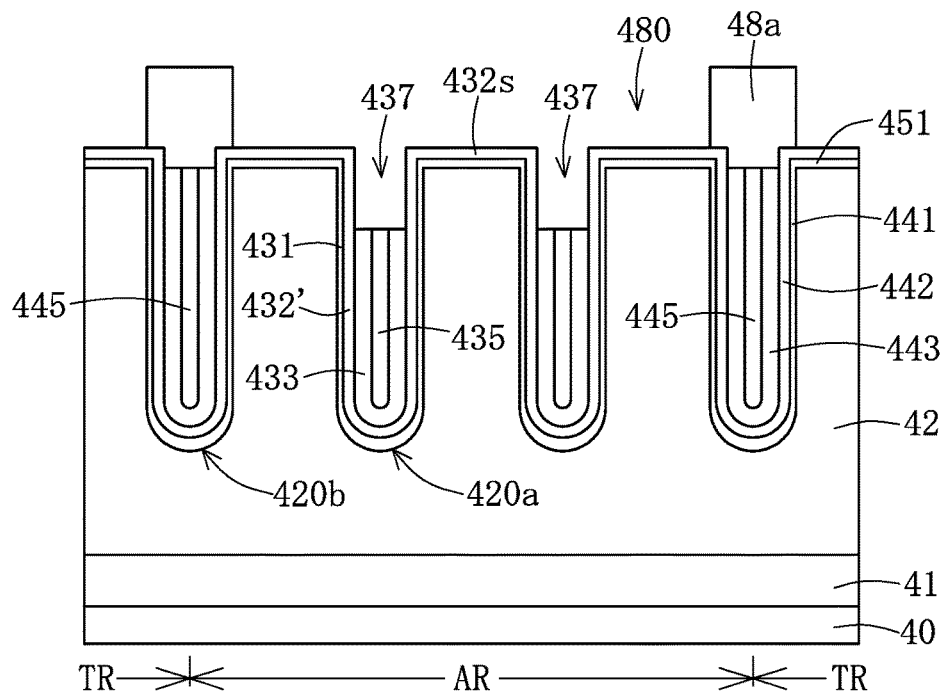

Subsequently, as shown in FIG. 6B, a portion of the third dielectric material 433' and a portion of the polysilicon structure 435', both of which are positioned at the upper portion of the cell trench 420a, are removed to form the third dielectric layer 433 and the shielding electrode 435.

Specifically, a photoresist layer 48a is formed on the termination trench 420b to cover the terminal electrode 445 and the third insulating layer 443. The photoresist layer 48a has an opening 480 to expose the cell trench 420a. Subsequently, an etching step is performed to remove the portions of the third dielectric material 433' and the polysilicon structure 435', and thereby forming a notch 437 in the cell trench 220a. In one embodiment, the notch 437 has a depth ranging from 1 to 1.3 µm.

Specifically, after the portions of the third dielectric material 433' and the polysilicon structure 435' are removed, the hard mask 432s and the second dielectric material 432' can serve as a mask to protect the first dielectric layer 431, the first insulating layer 441 and the passivation layer 451 from being etched. The photoresist layer 48a is removed after the removals of the portions of the third dielectric material 433' and the polysilicon structure 435'.

Figure 6C:
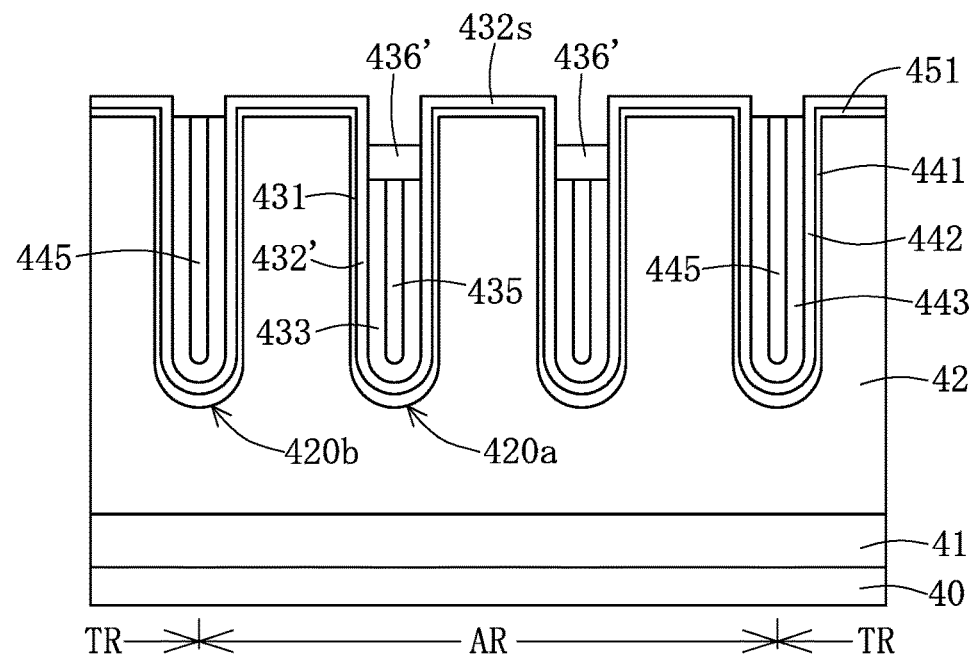

Please refer to FIGS. 6B and 6C. The inter-electrode dielectric layer 436 is formed to cover the third dielectric layer 433 and the shielding electrode 435. It is worth noting that there is a space remained in the notch 437 without filling with the inter-electrode dielectric layer 436. As aforementioned, the notch 437 has the depth ranging from 1 to 1.3 µm, and the inter-electrode dielectric layer 436 has a thickness ranging from 200 to 300 nm.

Figure 6D:
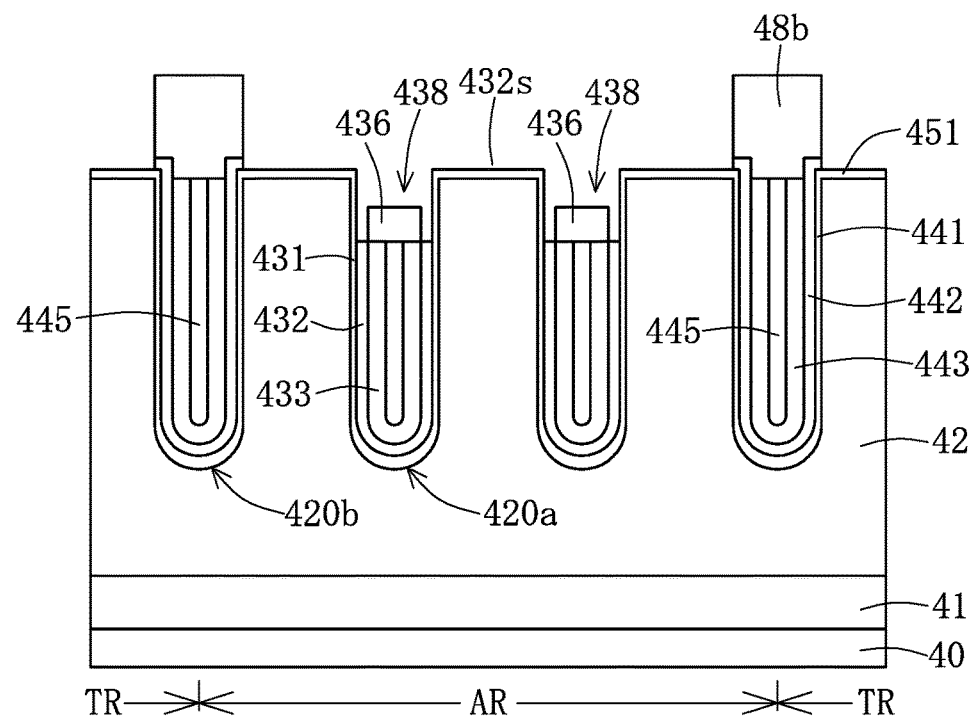

Please refer to FIG. 6D. A portion of the second dielectric material 423' positioned at the upper portion of the cell trench 420a and the hard mask 432s covering the passivation layer 451 are removed to define a preset region 438 of the gate electrode. The preset region 438 of the gate electrode includes two recesses, one of which is located between one sidewall of the inter-electrode dielectric layer 436 and the first dielectric layer 431, and the other one is located between the opposite sidewall of the inter-electrode dielectric layer 436 and the first dielectric layer 431.

Figure 6E:
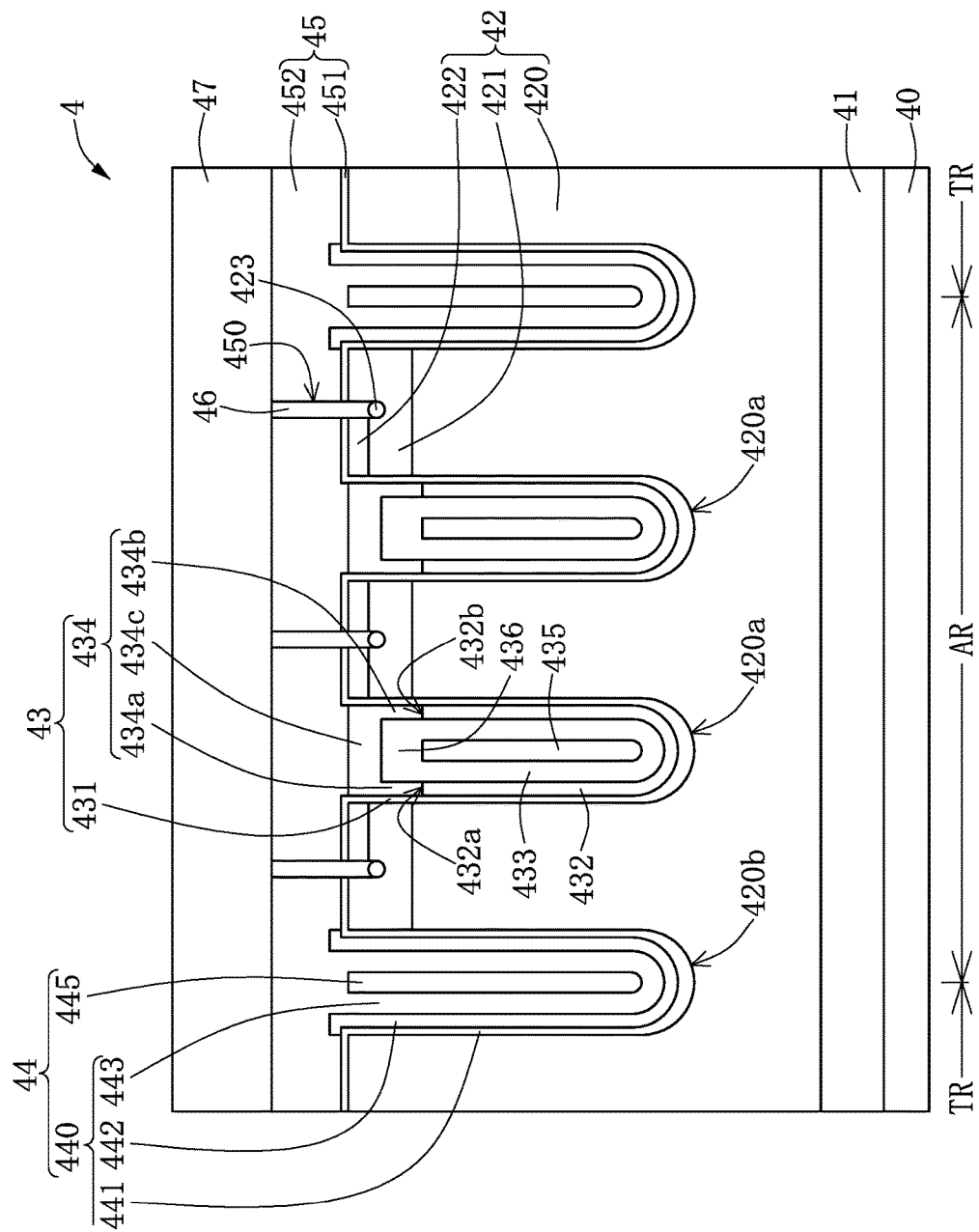

Please refer to FIGS. 6D and 6E. The gate electrode 434 is formed in the preset region 438. The gate electrode 434 includes the conductive layer 434a connecting the first ending surface 432a of the second dielectric layer 432, the second conductive layer 434b connecting the second ending surface 432b, and the third conductive layer 434c. The third conductive layer 434c is located over the inter-electrode dielectric layer 436 and insulated from the shielding electrode 435 through the inter-electrode dielectric layer 436.

Thereafter, the body region 431, the source region 422 and the redistribution layer are formed. The processes of forming the body region 431, the source region 422 and the redistribution layer have been described above and are omitted herein.

Figure 7:
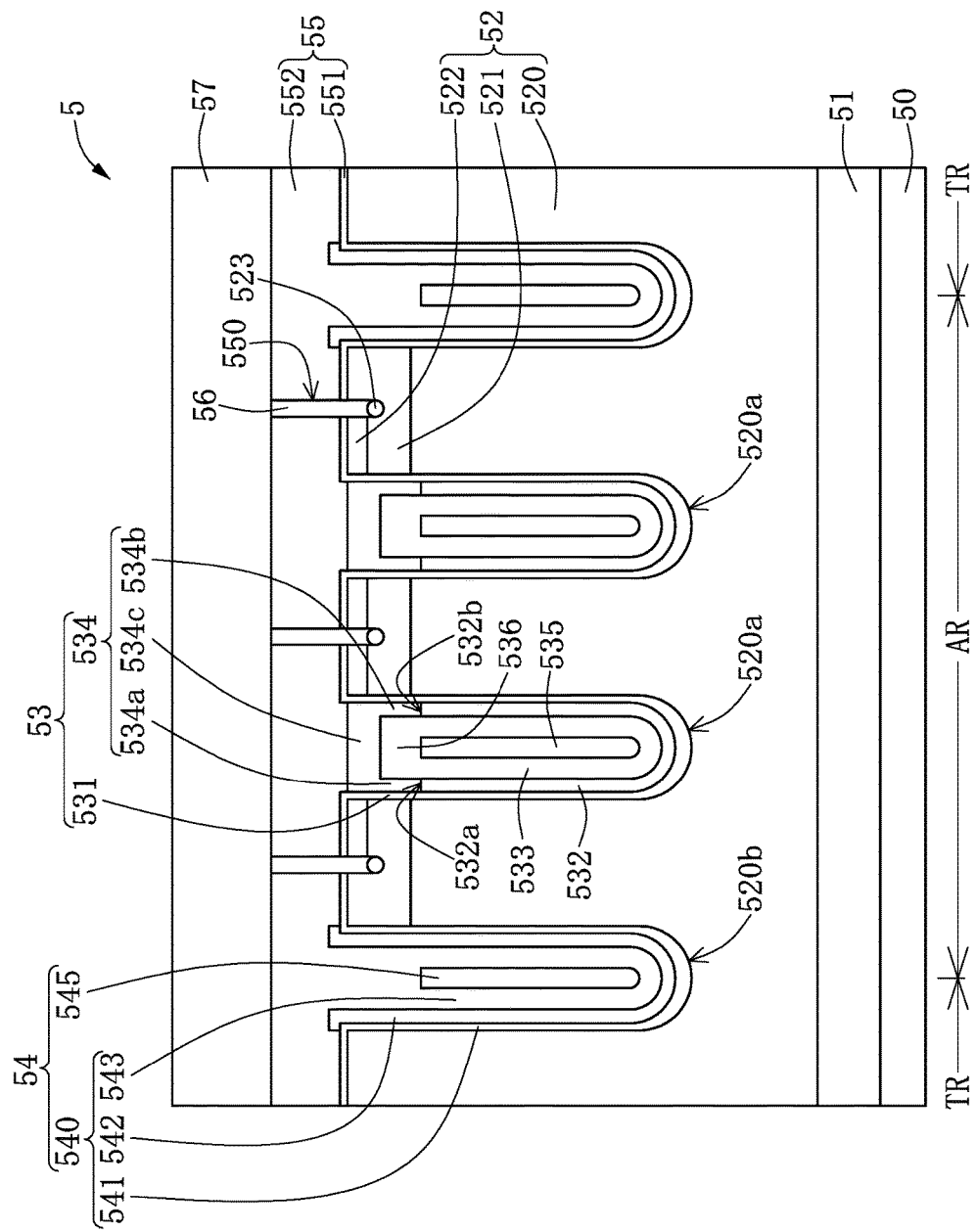
FIG. 7 shows a cross-sectional schematic view of a trench power semiconductor device in accordance with another embodiment of the instant disclosure.

Please refer to FIG. 7. The terminal electrode 545 of the trench power semiconductor device 5 in the instant embodiment is only located at the lower portion of the termination trench 520b. In other words, the top of the terminal electrode 545 is located at a level lower than an end face of the second insulating layer 542.

Figure 7A:
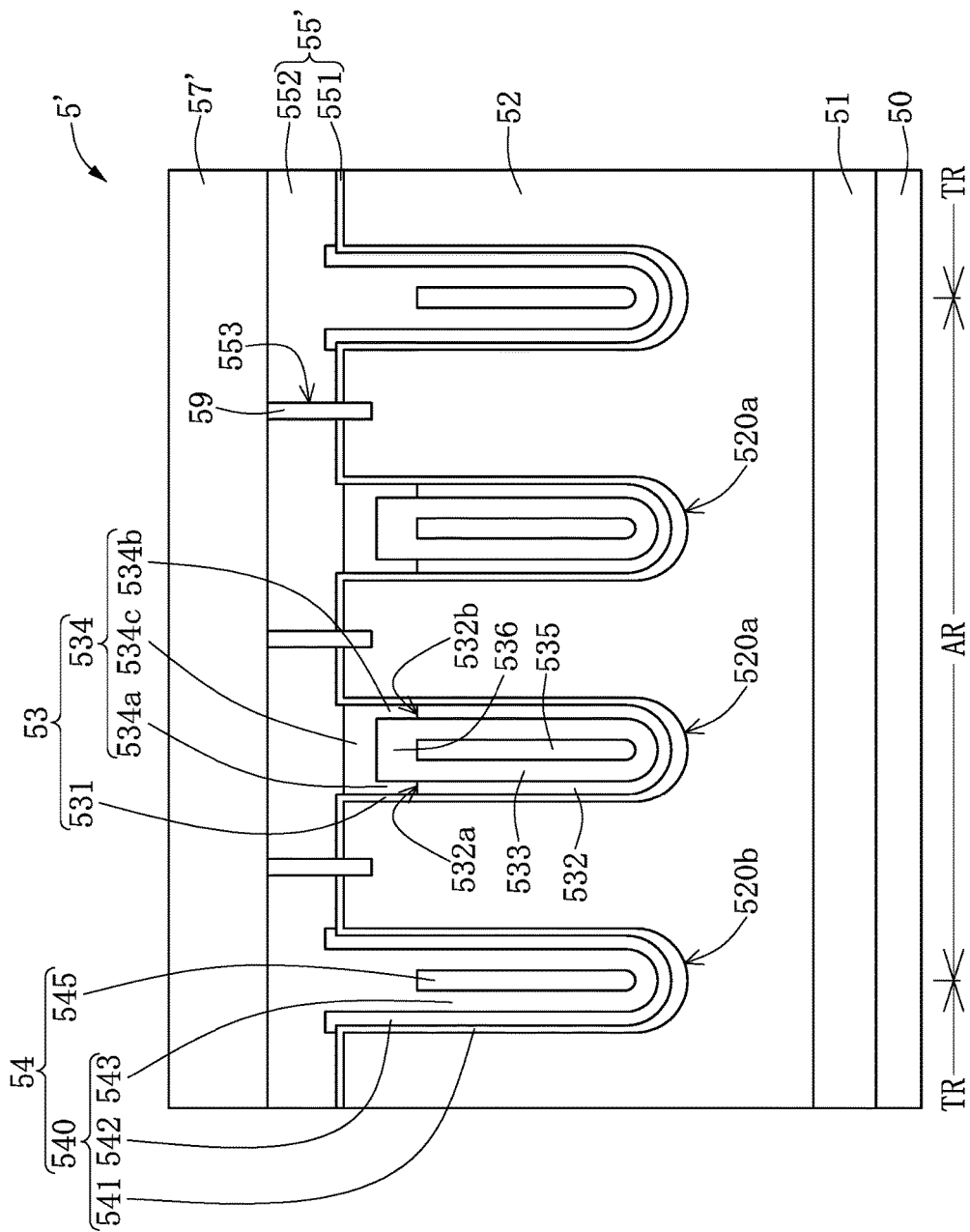
FIG. 7A shows a cross-sectional schematic view of a trench power semiconductor device in accordance with another embodiment of the instant disclosure.

Please refer to FIG. 7A, which illustrates the trench gate structure 53 and terminal electrode structure 54 shown in FIG. 7 also can be integrated into the trench power semiconductor device 5' with the schottky diode. The structure of the schottky diode is the same as the embodiment shown in FIG. 2B and description is omitted herein.

The terminal electrode structures 24, 34, 44, 54 provided in the embodiments of the instant disclosure are interchangeable with each other. As long as the breakdown voltage of the trench power semiconductor device can satisfy the design requirement, the combinations of the trench gate structures 23, 33, 43, 53, and the terminal electrode structures 24, 34, 44, 54 are not limited to the examples provide herein.

Figure 8A:
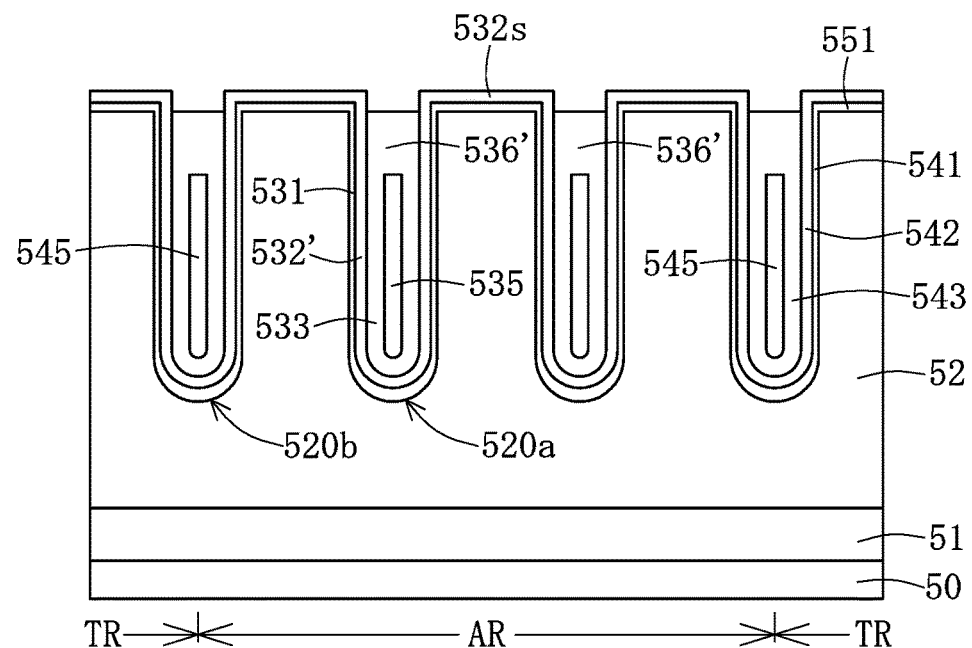
FIGS. 8A to 8C respectively shows cross-sectional schematic views of a trench power semiconductor device in different steps in accordance with an embodiment of the instant disclosure.
Figure 8B:
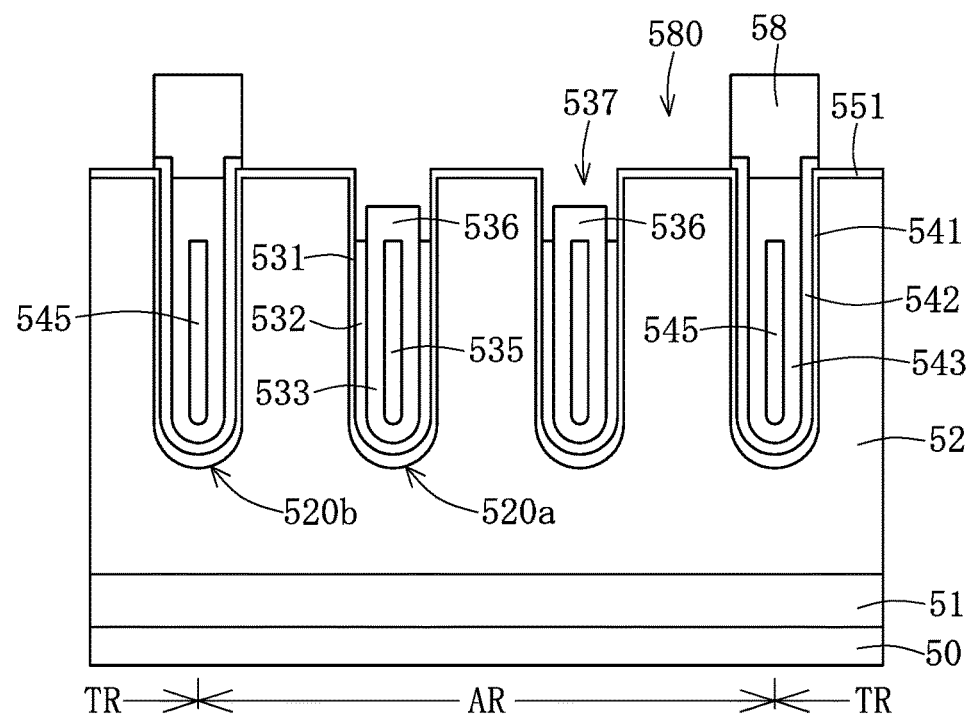
Figure 8C:
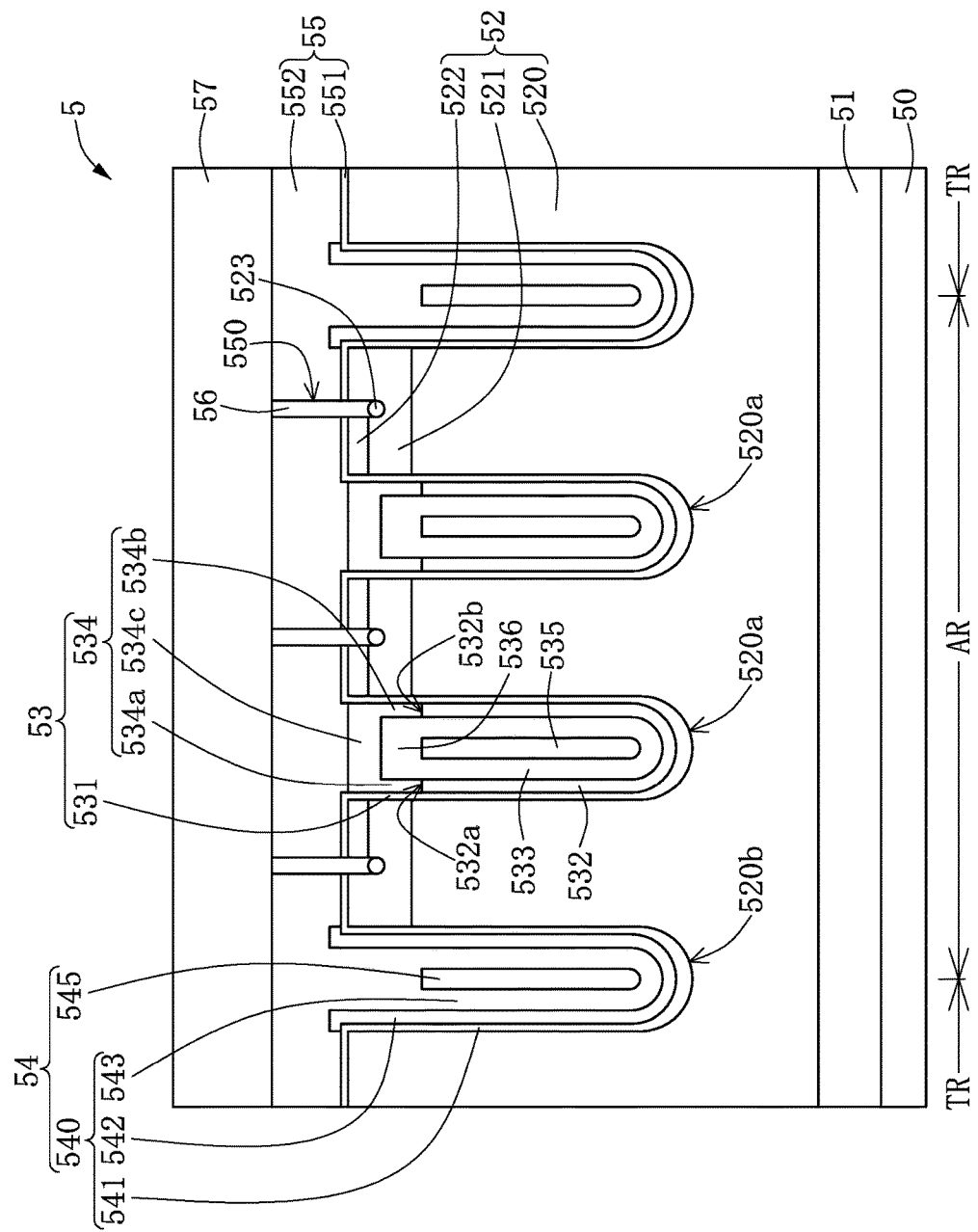

Please refer to FIG. 8A to FIG. 8C. The trench power semiconductor device 5 shown in FIG. 7 can be fabricated by the processes shown in FIG. 8A to FIG. 8C.

Please refer to FIG. 8A. The buffer layer 51 and the epitaxial layer 52 have been formed on the substrate 50. The epitaxial layer 52 has at least one cell trench 520a formed therein and located in the active region AR and at least one termination trench 520b formed therein and located in the termination region TR.

The first dielectric layer 531, the second dielectric material 532', the third dielectric layer 533, the shielding electrode 535 and an inter-electrode dielectric material 536' covering the shielding electrode 535 have been formed in the cell trench 520a. The first insulating layer 541, the second insulating layer 542, the third insulating layer 543 and the terminal electrode 545 have been formed in the termination trench 520b.

In the instant embodiment, the shielding electrode 535 and the terminal electrode 545 are respectively positioned at the lower portions of the cell trench 520a and the termination trench 530b. Furthermore, the third insulating layer 543 covers the top of the terminal electrode 545 and completely encloses the terminal electrode 545.

As shown in FIG. 8A, the passivation layer 551 also has been formed on the surface of the epitaxial layer 52, and a hard mask 532s is formed on the passivation layer 551. The passivation layer 551, the first dielectric layer 531, and the first insulating layer 541 can be made of the same material and be fabricated during the same process. The hard mask 532s, the second dielectric material 532' and the second insulating layer 542 can be made of the same materials and be fabricated during the same deposition process.

Subsequently, as shown in FIG. 8B, a portion of the second dielectric material 532' positioned in the cell trench 520a and the hard mask 532s are removed by performing a selective etching step. As such, a preset region 537 of the gate electrode can be defined in the cell trench 520a.

Specifically, before performing the selective etching step, a photoresist layer 58 is formed to protect the terminal electrode structure 54 in the termination region TR. The photoresist layer 58 has an opening 580 to expose the cell trench 520a in the active region AR.

Subsequently, the selective etching steps are performed in two different stages. It is noted that the materials of the first dielectric layer 531, the inter-electrode dielectric layer 536, and the third dielectric layer 533 are different from the second dielectric material 532'. Thus, the preset region 537 of the gate electrode can be defined by using the first dielectric layer 531, the inter-electrode dielectric layer 536, and the third dielectric layer 533 as a mask during one of the selective etching steps, and by using the second dielectric material 532' as another mask during the other selective etching step.

Specifically, the second dielectric material 532' and the hard mask 532s can serve as an etching mask in the first stage, in which the selective etching step is performed to remove a portion of the inter-electrode dielectric material 536'positioned over the shielding electrode 535, and thereby forming the inter-electrode dielectric layer 536 having a thickness of about 200 nm to 300 nm in the cell trench 520a.

The first dielectric layer 531, the inter-electrode dielectric layer 536 and the third dielectric layer 533 can serve as an etching mask in the second stage, in which the selective etching step is performed to remove a portion of the second dielectric material 532' positioned in the cell trench 520a and the hard mask 532s on the passivation layer 551. As such, the preset region 537 of the gate electrode can be defined in the cell trench 520a.

Additionally, after the portion of the second dielectric material 532' is removed, two recesses are formed. One recess is defined between the first dielectric layer 531 and one sidewall of the inter-electrode dielectric layer 536, and the other recess is defined between the first dielectric layer 531 and the opposite sidewall of inter-electrode dielectric layer 536.

Subsequently, as shown in FIGS. 8B and 8C, the preset region 537 of the gate electrode is filled with the polysilicon structure to form the gate electrode 534. The body region 521, the source region 522 and the redistribution layer are fabricated in sequence. The processes for forming the body region 521, the source region 522 and the redistribution layer have been described above and are omitted herein.

In summary, in the trench power semiconductor device provided in the instant disclosure, the insulating layer surrounding the shielding electrode includes the first, second and third dielectric layers, which are made of different materials. The gate electrode is interposed among the first, second and third dielectric layers.

Accordingly, in the manufacturing method of the trench gate structure, the position and shape of the gate electrode can be defined in advance through the selective etching step, and thereby avoiding the formation of the point portion at the bottom side of the first or second conductive layer closer to the shielding electrode. Thus, in the trench power semiconductor device of the instant disclosure, by avoiding the point effect the impact on the withstand voltage of the gate electrode can be reduced.

In addition, in some embodiments, the gate electrode and the shielding electrode are isolated from each other by the third dielectric layer. Compared to the prior art, the third dielectric layer interposed between gate electrode and the shielding electrode has a greater thickness so that the capacitance between the gate electrode and the shielding electrode (electrically connected to the source) can be reduced.

The above-mentioned descriptions represent merely the exemplary embodiment of the present disclosure, without any intention to limit the scope of the present disclosure thereto. Various equivalent changes, alterations or modifications based on the claims of present disclosure are all consequently viewed as being embraced by the scope of the present disclosure.

What is claimed is:

1. A trench power semiconductor device comprising:
   a substrate;
   an epitaxial layer formed on the substrate, wherein the epitaxial layer has at least one cell trench formed therein; and
   a trench gate structure arranged in the cell trench, wherein the trench gate structure comprises:
      a shielding electrode arranged in the cell trench;
      a first dielectric layer formed in the cell trench and having a contour substantially similar to that of an inner wall surface of the cell trench, wherein the first dielectric layer has a first upper inner wall and a lower inner wall connected to the first upper inner wall;
      a second dielectric layer covering the lower inner wall, wherein the second dielectric layer is made from a different material than the first dielectric layer;
      a gate electrode arranged in the cell trench, wherein the gate electrode includes a first conductive layer covering the first upper inner wall, and the first conductive layer has a bottom end connected to a first ending surface of the second dielectric layer; and
      a third dielectric layer conformingly covering inner surfaces of the first conductive layer and the second dielectric layer, wherein the third dielectric layer surrounds the shielding electrode so as to isolate the shielding electrode from the gate electrode;
   wherein a vertical central line of the first conductive layer is spaced apart away from a vertical central line of the shielding electrode.

2. The trench power semiconductor device according to claim 1, further comprising a body region and a source region, wherein the body region and the source region are formed in the epitaxial layer, the body region surrounds the cell trench, and the source region is located above the body region.

3. The trench power semiconductor device according to claim 2, wherein the first ending surface is located at a level equal to or lower than a lowest edge of the body region.

4. The trench power semiconductor device according to claim 1, wherein the first dielectric layer has a second upper inner wall facing to the first upper inner wall and connected to the lower inner wall, the gate electrode further includes a second conductive layer covering the second upper inner wall and disposed facing to the first conductive layer, and the second conductive layer has a bottom end connected to a second ending surface of the second dielectric layer;
   wherein the first and second conductive layers are spaced apart from each other by the third dielectric layer.

5. The trench power semiconductor device according to claim 4, wherein part of the shielding electrode is disposed overlapping with the first conductive layer and the second conductive layer.

6. The trench power semiconductor device according to claim 4, wherein the shielding electrode does not overlap with either the first conductive layer or the second conductive layer.

7. The trench power semiconductor device according to claim 4, wherein the gate electrode further includes a third conductive layer extending between the first conductive layer and the second conductive layer, and the third conductive layer is located over and insulated from the shielding electrode;
wherein the first, second, and third conductive layers connect to one another so that a cross-sectional shape of the gate electrode forms a reversed U-shape.

8. The trench power semiconductor device according to claim 1, further comprising a terminal electrode structure, wherein the epitaxial layer has at least one termination trench formed therein, the terminal electrode structure is disposed in the termination trench, and the terminal electrode structure includes:
a terminal electrode arranged in the termination trench; and
a terminal dielectric layer covering an inner wall surface of the termination trench and having a contour substantially similar to a contour of the inner wall surface of the termination trench, wherein the terminal dielectric layer includes a first insulating layer, a second insulating layer and a third insulating layer sequentially stacked on the inner wall surface of the termination trench, the second insulating layer is made from a different material than the first insulating layer, and the terminal electrode is insulated from the epitaxial layer through the terminal dielectric layer.

9. The trench power semiconductor device according to claim 8, wherein the terminal electrode extends from an upper portion of the termination trench to a lower portion of the termination trench.

10. The trench power semiconductor device according to claim 8, wherein a top of the terminal electrode is located at a level lower than or equal to an end face of the second insulating layer.

11. The trench power semiconductor device according to claim 8, further comprising a conductive layer, wherein an end face of the second insulating layer is located lower than a top surface of the first insulating layer and a top surface of the third insulating layer to define a recess among the first, second, and third insulating layers, and the conductive layer is arranged in the recess and has a thickness substantially the same as a thickness of the second insulating layer.

12. The trench power semiconductor device according to claim 1, further comprising:
an interlayer dielectric layer disposed on the epitaxial layer and covering the cell trench, wherein the interlayer dielectric layer has at least one schottky contact opening; and
a conductive plug penetrating the interlayer dielectric layer, wherein the conductive plug is electrically connected to the epitaxial layer through the schottky contact opening to form a schottky diode.

13. The trench power semiconductor device according to claim 1, wherein an entire thickness of the first conductive layer in a direction parallel to a surface of the epitaxial layer and an entire thickness of the second dielectric layer in a direction parallel to the surface of the epitaxial layer both range from 200 nm to 250 nm.

14. A trench power semiconductor device comprising:
a substrate;
an epitaxial layer disposed on the substrate and having at least one cell trench and at least one termination trench formed therein;
a trench gate structure is arranged in the cell trench; and
a terminal electrode structure arranged in the termination trench, wherein the terminal electrode structure includes:
a terminal dielectric layer having a contour substantially similar to a contour of an inner wall surface of the termination trench, wherein the terminal dielectric layer includes a first insulating layer, a second insulating layer and a third insulating layer sequentially stacked on the inner wall surface of the termination trench, the second insulating layer is made from a different material than the third insulating layer, and an end face of the second insulating layer is located lower than a top surface of the first insulating layer and a top surface of the third insulating layer to define a recess among the first, second, and third insulating layers;
a conductive layer arranged in the recess, wherein the conductive layer is connected to one of the two end surfaces of the second insulating layer, which is closer to the trench gate structure; and
a terminal electrode arranged in the termination trench and isolated from the conductive layer by the third insulating layer.

15. The trench power semiconductor device according to claim 14, wherein a top of the terminal electrode is located at a level lower than or equal to the end face of the second insulating layer.

16. The trench power semiconductor device according to claim 14, wherein part of the terminal electrode overlaps with the conductive layer.

17. The trench power semiconductor device according to claim 14, wherein the terminal electrode does not overlap with the conductive layer.

18. The trench power semiconductor device according to claim 14, wherein an entire thickness of the conductive layer in a direction parallel to a surface of the epitaxial layer and an entire thickness of the second insulating layer in a direction parallel to a surface of the epitaxial layer both range from 200 nm to 250 nm.

19. A trench power semiconductor device comprising:
a substrate;
an epitaxial layer formed on the substrate, wherein the epitaxial layer has at least one cell trench formed therein; and
a trench gate structure arranged in the cell trench, wherein the trench gate structure comprises:
a shielding electrode arranged in the cell trench;
a first dielectric layer formed in the cell trench and having a contour substantially similar to that of an inner wall surface of the cell trench, wherein the first dielectric layer has a first upper inner wall and a lower inner wall connected to the first upper inner wall;
a second dielectric layer covering the lower inner wall, wherein the second dielectric layer is made from a different material than the first dielectric layer;
a gate electrode arranged in the cell trench, wherein the gate electrode includes a first conductive layer covering the first upper inner wall, and the first conductive layer has a bottom end connected to a first ending surface of the second dielectric layer; and a third dielectric layer conformingly covering inner surfaces of the first conductive layer and the second dielectric layer, wherein the third dielectric layer surrounds the shielding electrode so as to isolate the shielding electrode from the gate electrode;

wherein the entire thickness of the first conductive layer in a direction parallel to a surface of the epitaxial layer and the entire thickness of the second dielectric layer in a direction parallel to the surface of the epitaxial layer both range from 200 nm to 250 nm.

\* \* \* \* \*